United States Patent
Akiyama et al.

(10) Patent No.: US 11,283,438 B2
(45) Date of Patent: Mar. 22, 2022

(54) GATE DRIVE APPARATUS

(71) Applicant: DENSO CORPORATION, Kariya (JP)

(72) Inventors: Hironori Akiyama, Kariya (JP);
Akimasa Niwa, Kariya (JP); Masahiro Yamamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/224,749

(22) Filed: Apr. 7, 2021

(65) Prior Publication Data
US 2021/0258004 A1 Aug. 19, 2021

Related U.S. Application Data

(63) Continuation of application No. PCT/JP2019/037561, filed on Sep. 25, 2019.

(30) Foreign Application Priority Data

Oct. 12, 2018 (JP) .............................. JP2018-193430

(51) Int. Cl.
*H03K 3/00* (2006.01)
*H03K 17/00* (2006.01)
*H03K 17/082* (2006.01)
*H03K 17/16* (2006.01)
*H02M 1/08* (2006.01)

(52) U.S. Cl.
CPC .......... *H03K 17/0822* (2013.01); *H02M 1/08* (2013.01); *H03K 17/0828* (2013.01)

(58) Field of Classification Search
None
See application file for complete search history.

(56) References Cited

U.S. PATENT DOCUMENTS

| 9,172,365 | B2* | 10/2015 | Kandah .............. H03K 17/0822 |
| 10,439,482 | B2* | 10/2019 | Baranwal ............ H03K 17/166 |
| 10,979,039 | B2* | 4/2021 | Yamamoto .......... H03K 17/002 |
| 2003/0045041 | A1 | 3/2003 | Katoh et al. |
| 2003/0201516 | A1 | 10/2003 | Katoh et al. |
| 2007/0187217 | A1 | 8/2007 | Tai |
| 2011/0007536 | A1 | 1/2011 | Takamatsu et al. |
| 2020/0021282 | A1 | 1/2020 | Yamamoto et al. |

FOREIGN PATENT DOCUMENTS

| JP | 2009-183017 A | 8/2009 |
| JP | 2018-098982 A | 6/2018 |

* cited by examiner

*Primary Examiner* — Kenneth B Wells
(74) *Attorney, Agent, or Firm* — Posz Law Group, PLC

(57) ABSTRACT

A gate drive apparatus includes a driver, a peak voltage detector and a drive capability controller. The driver drives a gate of a first switching element as one of two switching elements respectively in an upper arm and a lower arm of a half-bridge circuit. The peak voltage detector detects a peak voltage at a second switching element in a situation where the first switching element is turned on. The drive capability controller calculates a value of drive capability when the driver turns on the first switching element, in a condition that the peak voltage at the second switching element does not exceed a tolerance value of a voltage at the second switching element according to a specification of the second switching element, and modifies the drive capability when the driver turns on the first switching element, based on a calculated result of the value of the drive capability.

14 Claims, 16 Drawing Sheets

GATE DRIVE APPARATUS

CROSS REFERENCE TO RELATED APPLICATIONS

The present application is a continuation application of International Patent Application No. PCT/JP2019/037561 filed on Sep. 25, 2019, which designated the U.S. and claims the benefit of priority from Japanese Patent Application No. 2018-193430 filed on Oct. 12, 2018. The entire disclosures of all of the above applications are incorporated herein by reference.

TECHNICAL FIELD

The present disclosure relates to a gate drive apparatus that drives a gate of a switching element.

BACKGROUND

A half-bridge circuit may have switching elements such as IGBT and MOSFET connected in series. In a situation where one of the switching elements is turned on, a fault may occur in response to a surge voltage applied to a main terminal of another one of the switching elements exceeding the breakdown voltage of the other switching element in the half-bridge circuit.

SUMMARY

The present disclosure describes a gate drive apparatus including a driver to drive a gate of one of two switching elements in a half-bridge circuit, a peak voltage detector to detect a peak voltage at a main terminal of another one of two switching elements, and a drive capability controller to calculate a value of drive capability in a situation where the driver is turned on.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
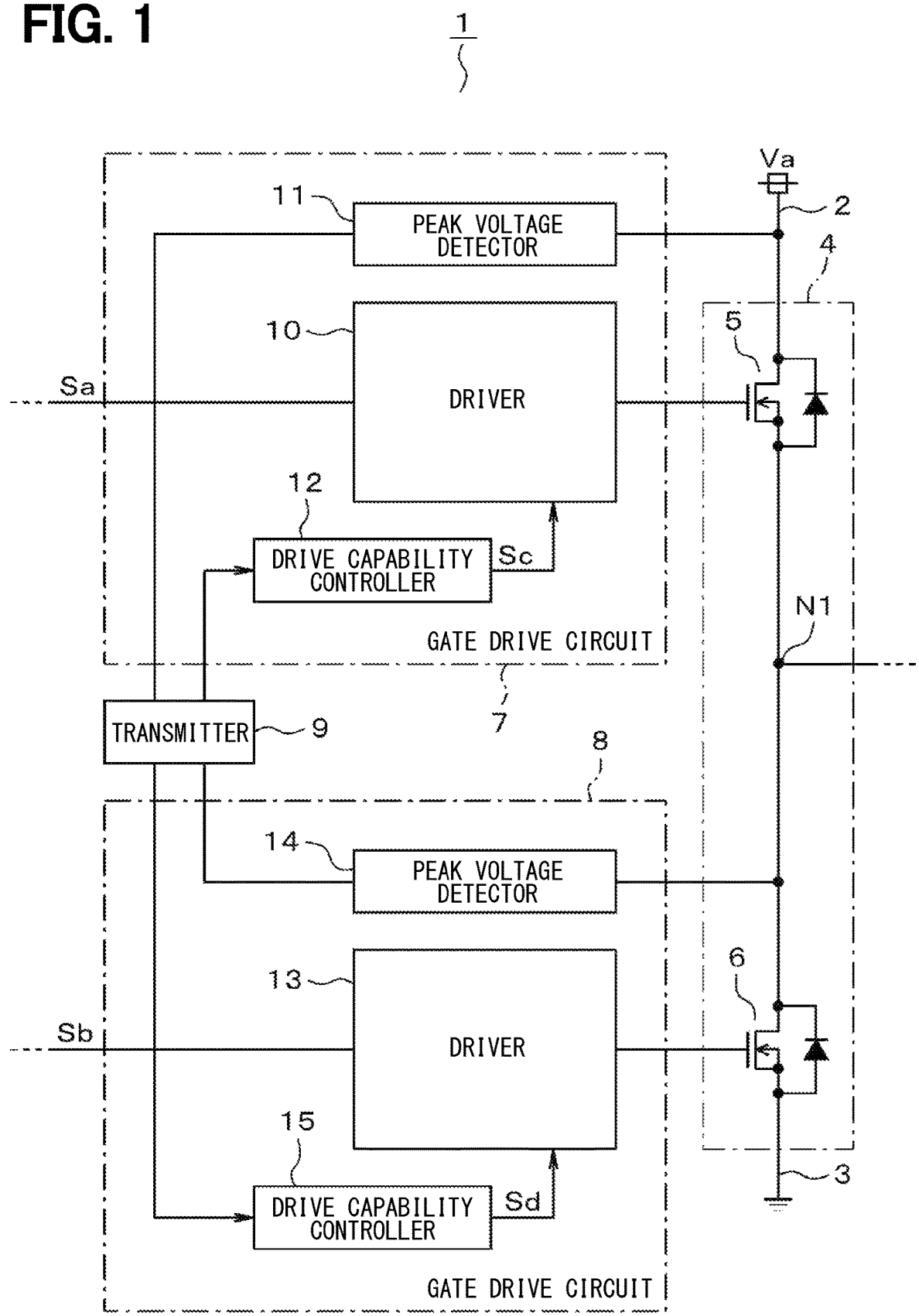
FIG. 1 schematically illustrates the configuration of a gate drive apparatus according to a first embodiment.

A surge voltage may occur at a half-bridge circuit in a gate drive apparatus for driving the respective gates of the switching elements included in the upper and lower arms of the half-bridge circuit. The surge voltage described above is a voltage corresponding to a parasitic inductance component of a current path determined by a system structure and the slope of a current, in other words, the rate of change in the current. The surge voltage rises as the rate of change in the current is larger. The current in this situation means a recovery current in a freewheeling diode connected in antiparallel to the switching element. Therefore, it is possible to suppress the surge voltage by increasing a drive capability at a time of turning on one of the switching elements, in particular, increasing a resistance value of, for example, a gate resistance to suppress the peak of the current.

For example, the resistance value of the gate resistance at a time of turning on the switching elements is determined in view of a condition where the highest surge voltage occurs, in other words, a region of higher voltage and larger current in order to drive under all of operating conditions with the determined value of the gate resistance. Thus, it is possible to prevent a situation where the surge voltage exceeds the withstand voltage of the switching element under all operating conditions.

However, the switching loss generated when turning on the switching elements, that is, the turn-on loss is proportional to the resistance value of the gate resistance at a time of turning on the switching elements. In a situation where the resistance value of the gate resistance is determined as described above, the suppression effect on the surge voltage becomes excessive in a lower voltage region and a smaller current region as an operating condition in which the generated surge voltage is relatively low, and an increase in turn-on loss due to suppressing the lowering of the drive capability may be a concern. As described above, there is a trade-off relationship between suppressing the surge voltage and reducing the turn-on loss.

On the other hand, it may be possible to suppress an increase in element loss while suppressing the surge voltage by monitoring the collector-emitter voltage and the main current and adjusting a gate current according to the collector-emitter voltage and the main current. Since the gate current is adjusted as the monitored collector-emitter voltage reaches an arbitrary threshold value, the adjustment of the most proper gate current may not be executed due to, for example, variation in elements or driving conditions. Therefore, it may be difficult to achieve suppression on the surge voltage and the reduction on the turn-on loss.

According to an aspect of the present disclosure, a gate drive apparatus includes a driver, a peak voltage detector and a drive capability controller. The driver drives a gate of a first switching element as one of two switching elements respectively in an upper arm and a lower arm of a half-bridge circuit. The peak voltage detector detects a peak voltage at a main terminal of a second switching element as another one of the two switching elements in a situation where the first switching element is turned on. The drive capability controller calculates a value of drive capability in a situation where the driver turns on the first switching element, in a condition that the peak voltage at the main terminal of the second switching element detected by the peak voltage detector does not exceed a tolerance value of a voltage at the main terminal of the second switching element determined according to a specification of the second switching element. The drive capability controller further modifies the drive capability in a situation where the driver turns on the first switching element, based on a calculated result of the value of the drive capability.

The peak voltage at the main terminal may be referred to as the peak of the surge voltage generated in a situation where a corresponding one of the switching elements is turned on. The tolerance value of the voltage at the main terminal may be referred to as, for example, a value lower than the withstand voltage of the switching element with a predetermined margin. Although it is unlikely to have a fault in the switching element in a situation where the voltage having the tolerance value is applied to the main terminal, the tolerance value is set as described above in consideration of a situation where the voltage having a value exceeding the tolerance value is applied to the main terminal and causes the switching element to have a fault.

According to the above aspect, the drive capability of the driver, in a situation where the driver turns on the first switching element, is optimized based on the detected value of the peak voltage and the tolerance value. By optimizing the drive capability, it is possible to prevent a surge voltage exceeding the tolerance value from being applied to the main terminal of the switching element under any operating conditions. By performing the optimization, the drive capability at the time of the driver turning on the first switching element may be enhanced until the peak of the surge voltage approaches to a value closer to the withstand voltage of the second switching element under any of the operating conditions. According to the aspect, an advantageous effect of suppressing the surge voltage without increasing the turn-on loss may be attained.

The following describes multiple embodiments with reference to the drawings. Hereinafter, in the respective embodiments, substantially the same configurations are denoted by identical symbols, and repetitive description will be omitted.

First Embodiment

The first embodiment of the present disclosure is described with reference to FIGS. 1 to 6.
(Configuration of Gate Drive Apparatus)
As illustrated in FIG. 1, a gate drive apparatus 1 according to the present embodiment drives two switching elements 5, 6. The switching elements 5, 6 are respectively included in an upper arm and a lower arm in a half-bridge circuit 4 connected between a pair of direct current power supply lines 2, 3. The switching elements 5, 6 may also be referred to as switching devices. The switching elements 5, 6 are power elements or power devices. The switching element includes an N-channel type MOS transistor (MOSFET) and a reflux diode connected between the drain and source of the MOSFET. The anode of the reflux diode is connected at the source side of the MOSFET. In other words, the reflux diode is connected in antiparallel to the MOSFET. In this situation, the reflux diode is provided as an element separate from the MOSFET. However, the reflux diode may be adopted as a body diode of the MOSFET as the reflux diode.

In the present embodiment, the switching element 5 corresponds to one of the switching elements included in the half-bridge circuit 4, and the switching element 6 corresponds to the other one of the switching elements included in the half-bridge circuit 4. The direct current power supply lines 2, 3 are supplied with a power supply voltage Va output from a direct current power supply (not shown) such as a battery. In this situation, the power supply voltage Va is a relatively high voltage such as several hundred volts. The drain of the switching element 5 is connected to the direct current power supply line 2 at a higher potential side. The source of the switching element 5 is connected to the drain of the switching element 6. The source of the switching element 6 is connected to the direct current power supply line 3 at a lower potential side. Although not shown, a load such as an inductor or the coil of a motor is connected to a node N1 as a common connecting node between the switching elements 5, 6.

The gate drive apparatus 1 includes gate drive circuits 7, 8 and a transmitter 9. The gate drive circuit 7 drives the switching element 5 at a higher potential side through PWM control based on a drive signal Sa provided from outside, and the driver 10 includes a peak voltage detector 11 and a drive capability controller 12. The drive signal Sa is a signal that commands the switching element 5 to turn on at a high level of the drive signal Sa, and commands the switching element 5 to turn off at a low level of the drive signal Sa.

The gate drive circuit 8 drives the switching element 6 at a lower potential side through PWM control based on a drive signal Sb provided from outside, and the driver 13 includes a peak voltage detector 14 and a drive capability controller 15. The drive signal Sb is a signal similar to the drive signal Sa. In this situation, the gate drive circuits 7, 8 are provided as separate devices, in particular, integrated circuits (IC) that are separate from each other.

The driver 10 drives the gate of the switching element 5, and corresponds to a first driver or a driver. The driver 10 turns on the switching element 5 in response to receiving the drive signal Sa at the high level for commanding the switching element 5 to turn on. The driver 10 turns off the switching element 5 in response to receiving the drive signal Sa at the low level for commanding the switching element 5 to turn off. The driver 10 may modify the drive capability at a time of turning on the switching element 5. The drive capability of the driver 10 is set to a value according to a capability setting signal Sc output from the drive capability controller 12.

The driver 13 drives the gate of the switching element 6, and corresponds to a second driver or an additional driver. The driver 13 turns on the switching element 6 in response to receiving the drive signal Sb at the high level for commanding the switching element 6 to turn on. The driver 13 turns off the switching element 6 in response to receiving the drive signal Sb at the low level for commanding the switching element 6 to turn off. The driver 13 may modify the drive capability at a time of turning on the switching element 6. The drive capability of the driver 13 is set to a value according to a capability setting signal Sd output from the drive capability controller 15.

The peak voltage detector 11 detects the peak voltage of the main terminal of the switching element 5 at a time of turning on the switching element 6, in other words, the peak of the surge voltage generated at the time of turn-on. The peak voltage detector 11 corresponds to a first peak voltage detector or a peak voltage detector. In this situation, the peak voltage at the main terminal of the switching element 5 is the peak of the drain voltage of the switching element 5 with reference to the potential at the node Ni, in other words, the peak of the voltage VDS between the drain and source of the switching element 5. The peak voltage detector 11 outputs the detected value of the peak voltage to the transmitter 9.

The peak voltage detector 14 detects the peak voltage of the main terminal of the switching element 6 at a time of turning on the switching element 5, in other words, the peak of the surge voltage generated at the time of turn-on. The peak voltage detector 14 corresponds to a second peak voltage detector or an additional peak voltage detector. In this situation, the peak voltage at the main terminal of the switching element 6 is the peak of the drain voltage of the switching element 5 with reference to the potential at the direct current power supply line 3, in other words, the peak of the voltage VDS between the drain and source of the switching element 6. The peak voltage detector 14 outputs the detected value of the peak voltage to the transmitter 9.

The transmitter 9 transmits the detected value of the peak voltage detected by the peak voltage detector 11 in the gate drive circuit 7 to the drive capability controller 15 in the gate drive circuit 8. Additionally, the transmitter 9 transmits the detected value of the peak voltage detected by the peak voltage detector 14 in the gate drive circuit 8 to the drive capability controller 12 in the gate drive circuit 7. The transmitter transmits respective detected value of the peak voltage detectors 11, 14 through an insulation device that provides insulation between the gate drive circuits 7, 8 provided as separate devices.

The drive capability controller 12 calculates an optimal value of the drive capability at a time of the driver 10 turning on the switching element 5 in a range where the detected value of the peak voltage detector 14, in other words, the peak of the surge voltage does not exceed an allowable value (or may be called as a tolerance value) of the voltage at the main terminal defined according to the specifications of the switching element 6. In this situation, the tolerance value is set to a value similar to the withstand voltage of the switching element 6. The drive capacity controller 12 modifies drive capability at a time of the driver 10 turning on the switching element 5 based on the calculated result. In this situation, the drive capability controller 12 generates a capability setting signal Sc for modifying the drive capability, and outputs the capability setting signal Sc to the driver 10.

The drive capability controller 15 calculates an optimal value of the drive capability at a time of turning on the driver 13 in a range where the detected value of the peak voltage detector 11, in other words, the peak of the surge voltage does not exceed an tolerance value of the voltage at the main terminal defined according to the specifications of the switching element 5. In this situation, the tolerance value is set to a value similar to the withstand voltage of the switching element 5. The drive capacity controller 15 modifies drive capability at a time of turning on the driver 13 based on the calculated result. In this situation, the drive capability controller 15 generates a capability setting signal Sc for modifying the drive capability, and outputs the capability setting signal Sd to the driver 13.

The drive capability controller 12 corresponds to a first drive capability controller or a drive capability controller, and the drive capability controller 15 corresponds to a second drive capability controller or an additional drive capability controller. The drive capability controllers 12, 15 respectively execute the calculation of the drive capability and the modification of the drive capability such that the detected value of the peak of the surge voltage conforms to the command value of the surge voltage. The command value of the surge voltage is a value lower than the respective withstand voltages of the switching elements 5, 6, it is unlikely that the switching elements 5, 6 have a fault even though the voltage having the command value is applied to the main terminal. However, the command value of the surge voltage may be set to a value such that that the voltage having the command value larger than or equal to the margin is applied to the main terminal and cause the switching elements 5, 6 to have a fault.

The drive capability controllers 12, 15 executes the calculation of a value of the drive capability every driving period of the switching elements 5, 6. Therefore, the peak voltage detectors 11, 14 respectively detect the peaks of the surge voltages generated at a time of turn-on at every driving period of the switching elements 5, 6.

In the present embodiment, the driving period of each of the switching elements 5, 6 is one cycle of PWM control. The drive capability controller 12 executes the modification of the drive capability until the start of turning on the switching element 5 at the subsequent driving period after the calculation of the drive capability.

(Summary of Process Related to Calculation and Modification of Drive Capability)

Figure 2:
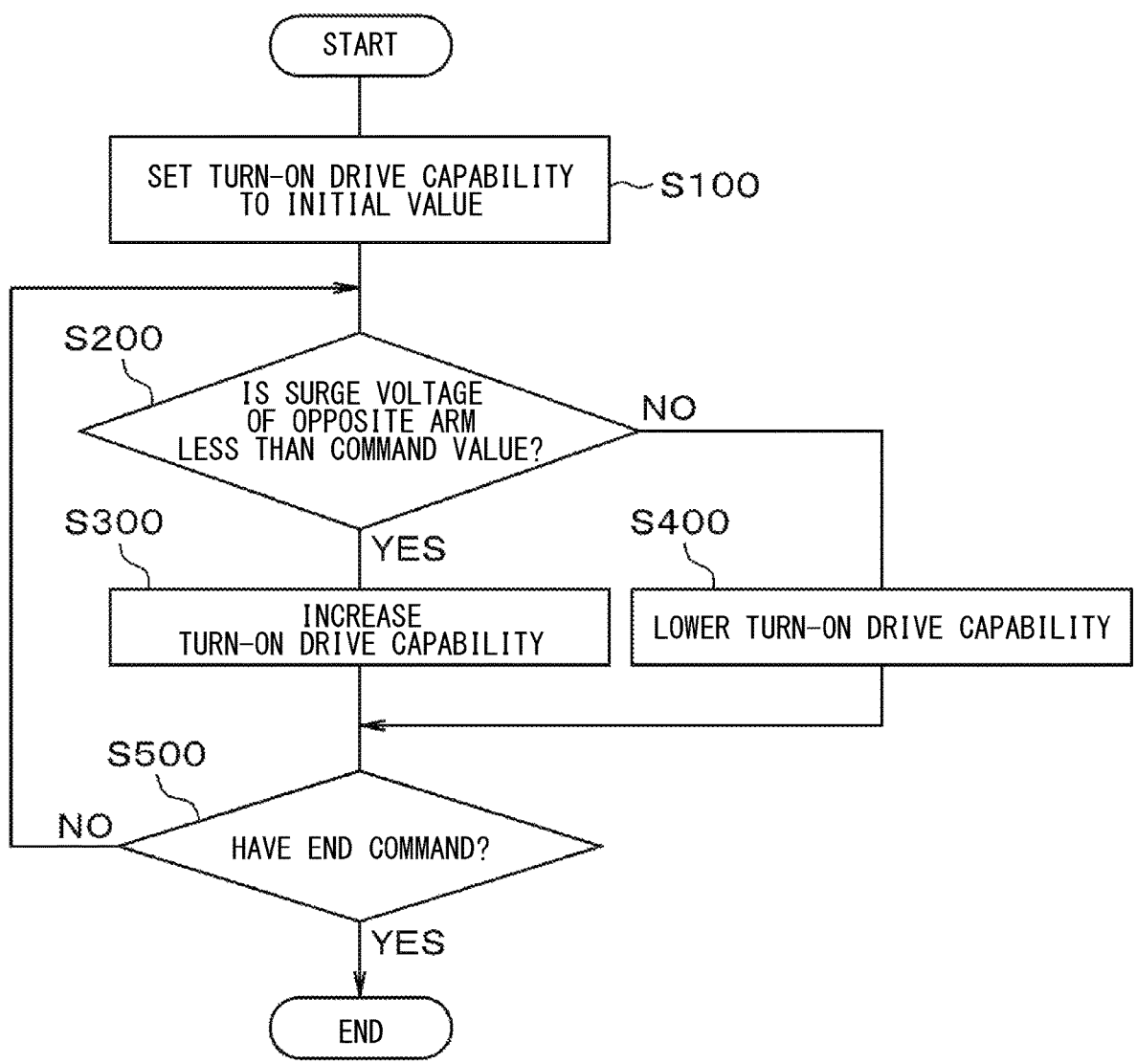
FIG. 2 illustrates the outline of a process related to the calculation and modification of drive capability according to the first embodiment.

The following describes the summary of computing and modifying the drive capability through the drive capability controllers 12, 15 in the above configuration with reference to FIG. 2. Although the following describes the process executed by the drive capability controller 12, it is similar to the process executed by the drive capability controller 15. In S100 initially executed after the start of process, the drive capability at the time of the driver 10 turning on the switching element 5 is set to an initial value. In this situation, the initial value is set to a value to be relatively low such that the generated surge voltage is sufficiently lower than the withstand voltage. In the following description, the drive capability at the time of turn-on may be referred to as turn-on drive capability.

In S200, it is determined whether or not the detected value of the peak voltage detector 14, in other words, the detected value of the peak of the surge voltage of the switching element 6 in the lower arm as an opposite arm is lower than the command value of the surge voltage. In a situation where the detected value of the peak of the surge voltage is less than the command value of the surge voltage, "YES" is determined in S200, and the process proceeds to S300. In S300, the turn-on drive capability of the driver 10 is modified to a value higher than the present value.

On the other hand, in a situation where the detected value of the peak of the surge voltage is larger than or equal to the command value of the surge voltage, "NO" is determined in S200, and the process proceeds to S400. In S400, the turn-on drive capability of the driver 10 is modified to a value lower than the present value. The process proceeds to S500 after executing S300 or S400. S500 determines whether or not an end command has been provided.

The above-mentioned end command is provided from an upper controller of the gate drive apparatus 1 when the system stops in response to detecting any of faults at a time where the power supply of the apparatus is at an off state. In a situation where the end command is provided, "YES" is determined in S500, and the present process ends. On the other hand, in a situation where the end command has not been given, "NO" is determined in S500, and the process returns to S200 and the processing subsequent to S200 is repeated.

(Configuration of Gate Drive Apparatus)

Figure 3:
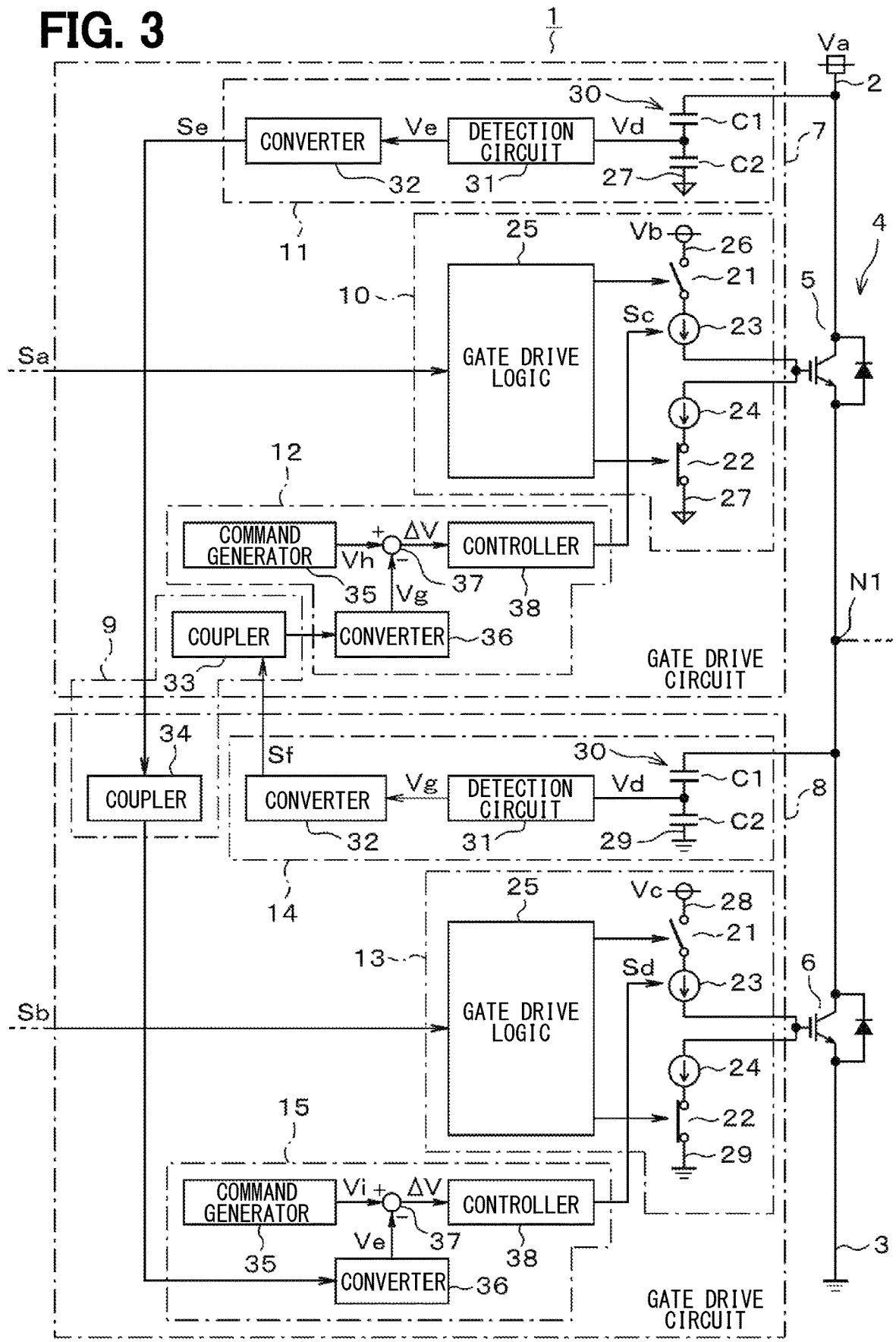
FIG. 3 schematically illustrates an example of the configuration of the gate drive apparatus according to the first embodiment.

The following describes the configuration of the gate drive apparatus 1 by adopting, for example, the configuration illustrated in FIG. 3. The gate drive apparatus 1 is not only limited to drive the N-channel type MOSFET illustrated in FIG. 1, it may drive a variety of power elements. In the example of configuration illustrated in FIG. 3, each of the switching elements 5, 6 to be driven includes an IGBT and a reflux diode. The reflux diode is connected between the collector and emitter of the IGBT. The anode of the reflux diode faces the emitter of the IGBT. In other words, the reflux diode is connected to the IGBT in antiparallel. In this situation, the reflux diode is separately provided from the IGBT. However, an RC-IGBT may be adopted as the switching elements 5, 6 without using the reflux diode.

The driver 10 drives the gate of the switching element 5 with a constant current. In other words, the driver 10 includes switches 21, 22, constant current supplies 23, 24, and a gate drive logic 25. The switch 21 includes a semiconductor switching device such as a P-channel MOSFET, and opens or closes the path between the power supply line 26 supplied with the power supply voltage Vb and an upper stream terminal of the current supply 23. The power supply voltage Vb is a voltage with reference to the potential of the power supply line 27 connected to the node N1, and sufficiently higher than the gate threshold voltage of the switching element 5.

The lower stream terminal of the current supply 23 is connected to the gate of the switching element 5. The current supply 23 is a constant current circuit that generates a constant current for supplying the constant current to the gate of the switching element 5 at a time of turn-on. In this situation, the current supply 23 can modify the current value based on the capability setting signal Sc provided from the drive capability controller 12. The switch 22 includes a semiconductor switching element such as an N-channel MOSFET, and opens or closes the path between the lower stream terminal of the current supply 24 and the power supply line 27.

The upper stream terminal of the current supply 24 is connected to the gate of the switching element 5. The current supply 24 is a constant current circuit that generates a constant current to pull out from the gate of the switching element 5 at a time of turn-on. As a configuration of the driver 10 at a time of turning off, a resistor having a constant resistance value may be provided in replacement of the current supply 24. In other words, the driver 10 may not have to drive with a constant current at a time of turning off.

The gate drive logic 25 complementarily turns on or off the switches 21, 22 based on the drive signal Sa. In this situation, the period of turning off both of the switches 21, 22, in other words, a so-called dead time is provided. According to the above configuration, the switching element 5 is turned on in response to turning on the switch 21, and the switching element 5 is turned off in response to turning on the switch 22. In the above configuration, the drive capability at a time of turning on the switching element 5 is modified by modifying the current value of the current supply 23 according to the capability setting signal Sc, in other words, the gate current at the time of turning on the switching element 5.

The driver 13, as similar to the driver 10, drives the gate of the switching element 6 with a constant current. With regard to the configuration of the driver 13, the description of the parts identical to the parts in the driver 10 is omitted. In this situation, the switch 21 opens or closes the path between the power supply line 28 supplied with the power supply voltage Vc and the upper stream terminal of the current supply 23. The power supply voltage Vc is a voltage with reference to the potential of the power supply line 29 connected to the direct current power supply line 3, and sufficiently higher than the gate threshold voltage of the switching element 6.

In this situation, the current supply 23 can modify the current value based on the capability setting signal Sc provided from the drive capability controller 15. The switch 22 opens or closes between the downstream terminal of the current source 24 and the power supply line 29. As a configuration of the driver 13 at a time of turning off, a resistor having a constant resistance value may be provided in replacement of the current supply 24. In other words, the driver 13, as similar to the driver 10, may not have to drive with a constant current at a time of turning off.

The gate drive logic 25 complementarily turns on or off the switches 21, 22 based on the drive signal Sb. According to the above configuration, the switching element 6 is turned on in response to turning on the switch 21, and the switching element 6 is turned off in response to turning on the switch 22. In the above configuration, the drive capability at a time of turning on the switching element 6 is modified by modifying the current value of the current supply 23 according to the capability setting signal Sd, in other words, the gate current at the time of turning on the switching element 6.

The peak voltage detector 11 includes a voltage divider circuit 30, a detection circuit 31 and a converter 32. The voltage divider circuit 30 includes two capacitors C1, C2. One terminal of the capacitor C1 is connected to the direct current power supply line 2, and the other one terminal of the capacitor C1 is connected to the power supply line 27 through the capacitor C2. In the divider circuit 30, two capacitors C1, C2 are connected in series. In this situation, the capacitors C1, C2 respectively has a high withstand voltage so that a fault does not occur even if a relatively high voltage generated between main terminals of the switching element 5 is applied. The voltage divider circuit 30 acquires the collector voltage of the switching element 5 with reference to the potential of the node N1, in other words, the voltage VCE between the collector and the emitter of the switching element 5 through the capacitance ratio between the capacitors C1, C2, and outputs the collector voltage from the common connection node between the capacitors C1, C2.

In this situation, the capacitors C1, C2 are formed on an identical semiconductor chip as, for example, a capacitor with an MIM structure. The detection circuit 31 is provided as a peak hold circuit, and receives the dividing voltage Vd through the divider circuit 30, and outputs a peak hold voltage Ve maintaining the peak of the input voltage. The peak hold voltage Ve output from the detection circuit 31 has a voltage value corresponding to the detected of the peak voltage. In the following, the peak hold voltage Ve may also be referred to as a detected voltage Ve. The converter 32 is provided as an analog/DUTY converter that receives an analog signal, and outputs a pulse width corresponding to the signal value, in other words, a pulse signal with a duty ratio. In this situation, the converter 32 receives the detected voltage Ve, and outputs a pulse signal Se having a duty ratio corresponding to the voltage value to the transmitter 9.

The peak voltage detector 14 has a configuration similar to the peak voltage detector 11. With regard to the configuration of the peak voltage detector 14, the description of the parts identical to the parts in the peak voltage detector 11 is omitted. In the divider circuit 30, one terminal of the capacitor C1 is connected to the node N1, and the other one terminal of the capacitor C1 is connected to the power supply line 29 through the capacitor C2. The voltage divider circuit 30 acquires the collector voltage of the switching element 6 with reference to the potential of the direct current power supply line 3, in other words, the voltage VCE between the collector and the emitter of the switching element 6 through the capacitance ratio between the capacitors C1, C2, and outputs the collector voltage from the common connection node between the capacitors C1, C2.

The divider circuit 31 receives the dividing voltage Vd through the divider circuit 30, and outputs the peak hold voltage Vg maintaining the peak of the input voltage. The peak hold voltage Vg output from the detection circuit 31 has a voltage value corresponding to the detected value of the peak voltage. In the following, the peak hold voltage Vg may also be referred to as a detected voltage Vg. In this situation, the converter 32 receives the detected voltage Vg, and outputs a pulse signal Sf having a duty ratio corresponding to the voltage value to the transmitter 9.

The transmitter 9 includes a magnetic coupler 33 built in the gate drive circuit 7, and a magnetic coupler 34 built in the gate drive circuit 8. The magnetic coupler 33 corresponds to an insulator, and insulates or transmits a pulse signal Sf output from the peak voltage detector 14 in the gate drive circuit 8 to the drive capability controller 12 in the gate drive circuit 7. The magnetic coupler 34 corresponds to an insulator, and insulates or transmits a pulse signal Se output from the peak voltage detector 11 in the gate drive circuit 7 to the drive capability controller 15 in the gate drive circuit 8.

The drive capability controller 12 includes a command generator 35, a converter 36, a subtractor 37 and a controller 38. The command generator 35 generates a command voltage Vh corresponding to the command value of the above-described surge voltage. The converter 36 is provided as a DUTY/analog converter that receives a pulse signal, and outputs the pulse width, in other words, an analog signal having the signal value corresponding to the duty ratio. In this situation, the converter 36 receives the pulse signal Sf through the magnetic coupler 33, and outputs a voltage having a voltage value corresponding to the duty ratio of the pulse signal Sf. The voltage output from the converter 36 is identical to the detected voltage Vg output from the detection circuit 31 in the peak voltage detector 14. In the following description, the voltage output from the converter may also be referred to as the detected voltage Vg.

The subtractor 37 subtracts the detected voltage Vg from the command voltage Vf to acquire a deviation ΔV corresponding to the difference between the detected value of the peak of the surge voltage and the command value. The controller 38 generates the capability setting signal Sc by executing the PI calculation for the deviation ΔV. The capability setting signal Sc is output to the driver 10, and the drive capability at a time of the driver 10 turning on the switching element 5 is set. The drive capability controller 12 acquires the deviation ΔV corresponding to the difference between the detected value of the peak of the surge voltage and the command value of the surge voltage, and modifies the drive capability at a time of the driver 10 turning on the switching element 5 so that the deviation ΔV becomes smaller gradually.

The drive capability controller 15 has a configuration identical to the drive capability controller 12. With regard to the configuration of the drive capability controller 15, the description of the parts identical to the parts in the drive capability controller 12 is omitted. In this situation, the command generator 35 generates a command voltage Vi corresponding to the command value of the above-described surge voltage. In this situation, the converter 36 receives the pulse signal Se through the magnetic coupler 34, and outputs a voltage having a voltage value corresponding to the duty ratio of the pulse signal Se. The voltage output from the converter 36 is identical to the detected voltage Ve output from the detection circuit 31 in the peak voltage detector 11. In the following description, the voltage output from the converter may also be referred to as the detected voltage Ve.

The subtractor 37 subtracts the detected voltage Ve from the command voltage Vi to acquire a deviation ΔV corresponding to the difference between the detected value of peak of the surge voltage and the command value. The controller 38 generates the capability setting signal Sd by executing the PI calculation for the deviation ΔV. The capability setting signal Sd is output to the driver 13, and the drive capability at a time of turning on the driver 13 is set. The drive capability controller 15 acquires the deviation ΔV corresponding to the difference between the detected value of the peak of the surge voltage and the command value of the surge voltage, and modifies the drive capability at a time of turning on the driver 13 so that the deviation ΔV becomes smaller gradually.

(Configuration of Driver at Turn-On)

Figure 4:
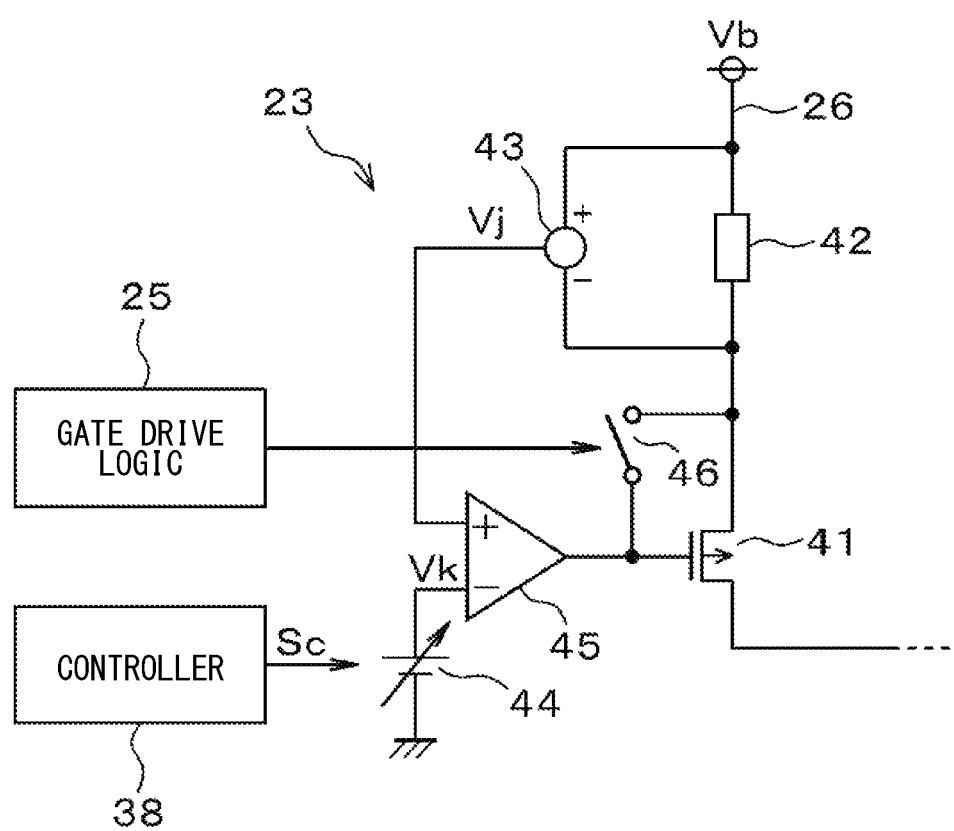
FIG. 4 schematically illustrates an example of the configuration of a drive at a turn-on side according to the first embodiment.

The following describes the configuration of the driver 10, 13 at turn-on by adopting, for example, the configuration illustrated in FIG. 4. Although FIG. 4 illustrates the configuration of the driver 10, it may also be applied to the driver 13. As illustrated in FIG. 4, in this situation, the current supply 23 includes, for example, a transistor 41, a resistor 42, a subtractor 43, a voltage supply 44 and an operational amplifier 45.

The transistor 41 is a P-channel type MOSFET. The source of the transistor 41 is connected to the power supply line 26 through the resistor 42. The drain of the transistor 41 is connected to the gate of the switching element 5. A switch 46 is connected between the source and gate of the transistor 41. The switch 46 is turned on or off by the control through the gate drive logic 25. The switch 46 has the function identical to the function of the switch 21. However, the on/off relation of the switch 46 is opposite to the on/off relation of the switch 21.

The subtractor 43 acquires a voltage Vj across the terminals (hereinafter referred to as an inter-terminal voltage Vj) of the resistor 42 by subtracting a terminal voltage of the resistor 42 from the other terminal voltage of the resistor 42. The voltage supply 44 is a variable voltage supply, and outputs a voltage having a voltage value corresponding to the capability setting signal Sc provided from the controller 38. A voltage Vk output from the voltage supply 44 is provided to the inverting input terminal of the operational amplifier 45. The inter-terminal voltage Vj of the resistor 42 output from the subtractor 43 is provided to the noninverting input terminal of the operational amplifier 45. The output of the amplifier 45 is provided to the gate of the transistor 41.

According to the above configuration, in a situation where the switch 46 is turned on, the transistor 41 is fixed to an off state so that the switching element 5 cannot be turned on. At the time of turning off the switching element 5, a signal for instructing the switch 46 to turn on is provided from the gate drive logic 25. According to the above configuration, in a situation where the switch 46 is turned off, the transistor 41 is driven to an on state according to the output of the operational amplifier 45. At the time of turning on the switching element 5, a signal for instructing the switch 46 to turn on is provided from the gate drive logic 25. The operational amplifier 45 controls the on-state of the transistor so that the inter-terminal voltage Vj of the resistor 42 matches the voltage Vk determined based on the capability setting signal Sc.

Figure 5:
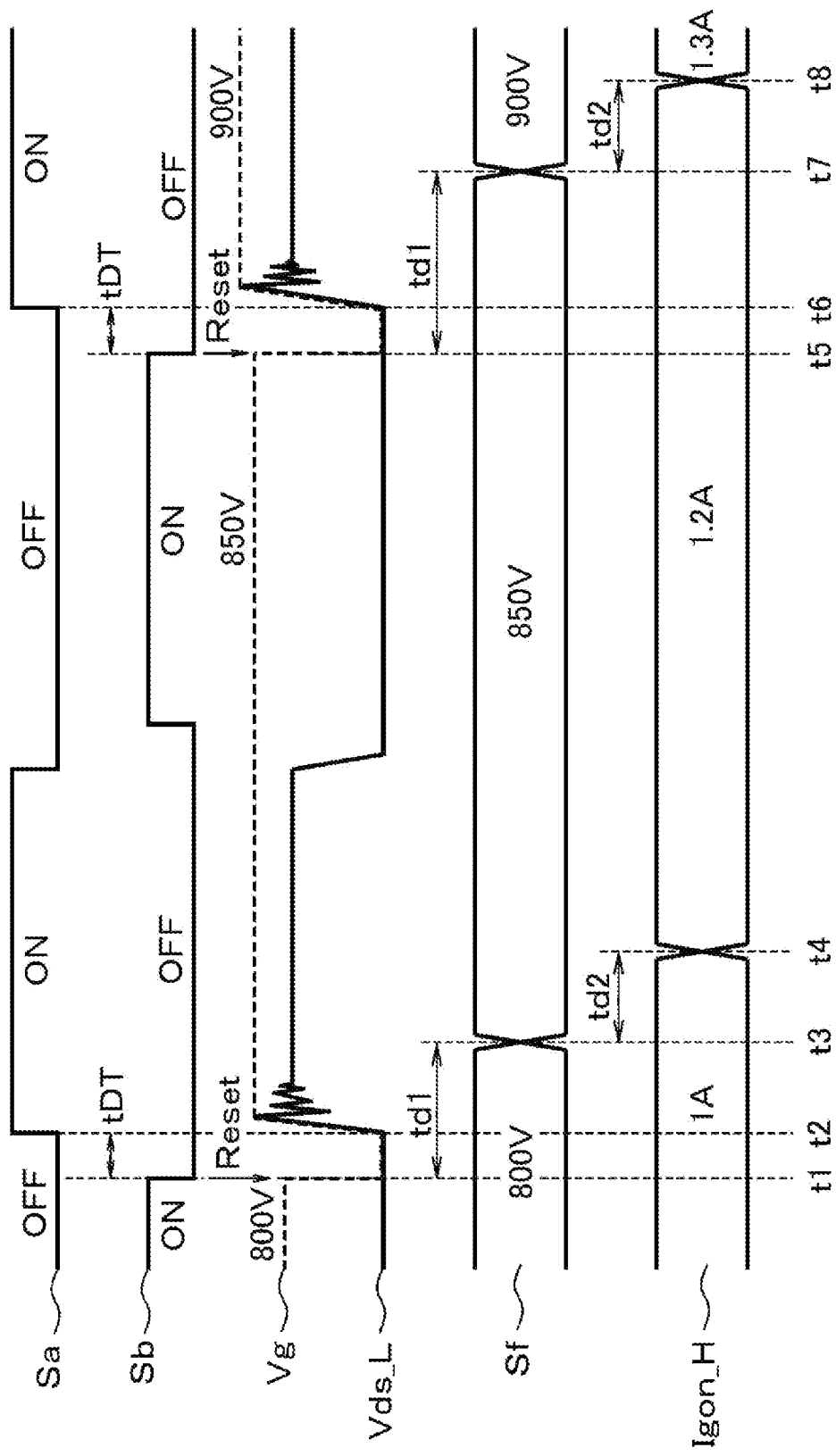
FIG. 5 is a timing chart for explaining a timing of each control through the gate drive apparatus according to the first embodiment.

The following describes the timing of each control in the above configuration with reference to a timing chart illustrated in FIG. 5. This section describes the control at the gate drive circuit as a main subject. However, the identical description is also applied to the gate drive circuit 8. In the following description, the switching element 5 driven by the gate drive circuit 7 is also called a subject arm, and the switching element 6 driven by the gate drive circuit 8 is also called as an opposite arm. In the timing chart illustrated in, for example, FIG. 5, "OFF" is appended for indicating the switching element as a driven subject is turned off during the drive signals Sa, Sb being at a low level, and "ON" is appended for indicating the switching element as a driven subject is turned on during the drive signals Sa, Sb being at a high level.

In this situation, the value of the detected voltage Vg of the detection circuit 31 of the peak voltage detector 14 is 800V and a pulse signal Sf output from the converter 32 of the peak voltage detector 14 has a duty representing 800V at a time point where the drive signal Sb turns to the low level from the high level, in other words, before a time t1 as a starting time of turning on the opposite arm. Before the time t1, the drive capability at the time of the driver 10 turning on the switching element 5 represented by the capability setting signal Sc, in other words, the gate current Igon_H as a current supplied to the gate of the switching element 5 at the time of turning on is 1 A. In the following, the gate current Igon_H may also be referred to as drive capability.

The output of the detection circuit 31 of the peak voltage detector 14 is reset at the time t1. The time period from the time t1 to a time point where the drive signal Sa turns to the high level from the low level, in other words, the time t2 as the starting time of turning on the subject arm is a dead time DT where both of the switching elements 5, 6 are turned off. The voltage Vds across the main terminals of the switching element 6 is substantially 0V at the dead time tDT, and becomes a voltage value closer to the power supply voltage Va during which the switching element 5 is turned on.

However, the peak of the voltage Vds_L has a value higher than the value of the power supply voltage Va in a situation where the switching element 5 is turned on. The peak of the voltage Vds_L, in other words, the peak of the surge voltage at the opposite arm varies according to the drive capability at the time of the driver 10 turning on the switching element 5 at the subject arm. In particular, the peak of the surge voltage at the opposite arm becomes lower by lowering the drive capability at the time of turning on the subject arm, and becomes higher by increasing the drive capability.

In this situation, the peak of the surge voltage is about 850V, and the value of the detected voltage Vg of the detection circuit 31 of the peak voltage detector 14 is 850V. At time t3 where the time t1 has elapsed by time td1, the pulse signal Sf output from the peak voltage detector 14 is modified to the duty representing 850V. The time td1 is a delay time set in advance so that the peak of the surge voltage can be reliably detected by the peak voltage detector 14. However, in a situation where the time td1 is unnecessarily lengthened, the time until the completion of detecting the peak of the surge voltage is lengthened, and, as a result, the modification of the drive capability based on the detected value is delayed. Therefore, it may be desirable to set the time td1 to the shortest possible while ensuring that the peak of the surge voltage is reliably detected.

At time t4 where the time td2 has been elapsed from the time t3, the drive capability at the time of turning on the subject arm is modified to be higher. In particular, the drive capacity is modified from 1 A to 1.2 A at time t4. The time td2 is a delay time depending on, for example, the responsiveness of each circuit. After that, after the time t5, which is the time when the drive signal Sb changes from the high level to the low level again, the same operation as the operation at the time t1 to the time t4 is repeated. In this situation, the period from time t1 to t5 corresponds to the driving period of the switching element 5.

According to the present embodiment described above, the following effects can be obtained.

The drive capability, at the time of the driver 10 turning on the switching element 6, of the gate drive circuit 7 is optimized based on the detected value of the peak of the surge voltage applied to the main terminal of the switching element 6 as the opposite arm and the tolerance value of the voltage at the main terminal determined based on the specifications of the switching element 6. The drive capability at the time of turning on the driver 13 of the gate drive circuit 8 is optimized based on the detected value of the peak of the surge voltage applied to the main terminal of the switching element 5 as the opposite arm and the tolerance value of the voltage at the main terminal determined based on the specifications of the switching element 5.

By optimizing the drive capability, it is possible to prevent a surge voltage exceeding the tolerance value from being applied to the main terminal of the switching element 5, 6 under any operating conditions. By performing the optimization, the drive capability at the time of the drivers 10, 13 respectively turning on the switching elements 5, 6 may be enhanced until the peak of the surge voltage approaches to a value closer to the withstand voltage of the switching element 5, 6 under any of the operating conditions. According to the present embodiment, an advantageous effect of suppressing the surge voltage without increasing the turn-on loss may be attained.

In the present embodiment, the gate drive circuits 7, 8 are separate devices. The gate drive apparatus 1 includes a transmitter 9 that transmits respective detected values of the peak voltage detectors 11, 14 between gate drive circuits 7, 8. The transmitter 9 transmits the respective detected values of the peak voltage detectors 11, 14 through the magnetic couplers 33, 34 for insulating the gate drive circuits 7, 8. The gate drive apparatus 1 may also be applied to applications in which the power supply voltage Va is relatively high. The configuration related to the present embodiment is optimal for a so-called high voltage system.

In the present embodiment, the peak of the surge voltage at the opposite arm is detected at the time of turning on the subject arm at the predetermined driving period. In the present embodiment, until the time t6 as the start of turning on the subject arm at a driving period subsequent to the predetermined driving period, the drive capability at the time of turning on the subject arm based on the detected value of the peak is calculated, and the calculated drive capability is actually reflected.

According to such control, the optimization of the drive capability can be promptly and reliably achieved. In other words, it is possible to attain the maximum effect. According to such control, it may also be applied to a system in which the driving periods of the switching elements 5, 6 are not constant, in other words, are variable. For reliably achieving such control, it is necessary to set the time td1 and design each circuit affecting the time td2 so that the total time of the time td1 and the time td2 is shorter than the driving period of the switching element 5, 6.

In this situation, the drivers 10, 13 respectively drive the gates of the switching elements 5, 6 with a constant current. The drive capability controllers 12, 15 respectively modify the drive capability at the time of turning on the drivers 10, 13 by modifying the gate currents at the time of turning on the switching elements 5, 6. According to such a configuration, it is possible to modify the drive capability at the time of turning on the drivers 10, 13 in higher precision, and it is possible to execute the above surge voltage with higher precision.

The gate drive apparatus 1 may drive a variety of power elements. For example, the gate drive apparatus 1 may drive an N-channel type MOSFET as shown in FIG. 1. Therefore, the following effects may be expected. In other words, in a system where a higher drive frequency is demanded, it is considered that a wide bandgap device such as a SiC-MOSFET is promising. However, as the drive frequency increases, the proportion of the turn-on loss to the total loss increases, so that the turn-on loss becomes more apparent. Therefore, the effect of reducing the turn-on loss acquired by the present embodiment becomes more beneficial in such an application. The gate drive apparatus 1 may drive an IGBT as shown in FIG. 3. Therefore, the following effects may be expected. That is, the turn-on loss increases in proportion to the current. In a situation where the configuration of the present embodiment is adopted for driving a Si-IGBT, which is expected to be adopted for a larger current, the effect of reducing the turn-on loss may be further enhanced.

Second Embodiment

Figure 6:
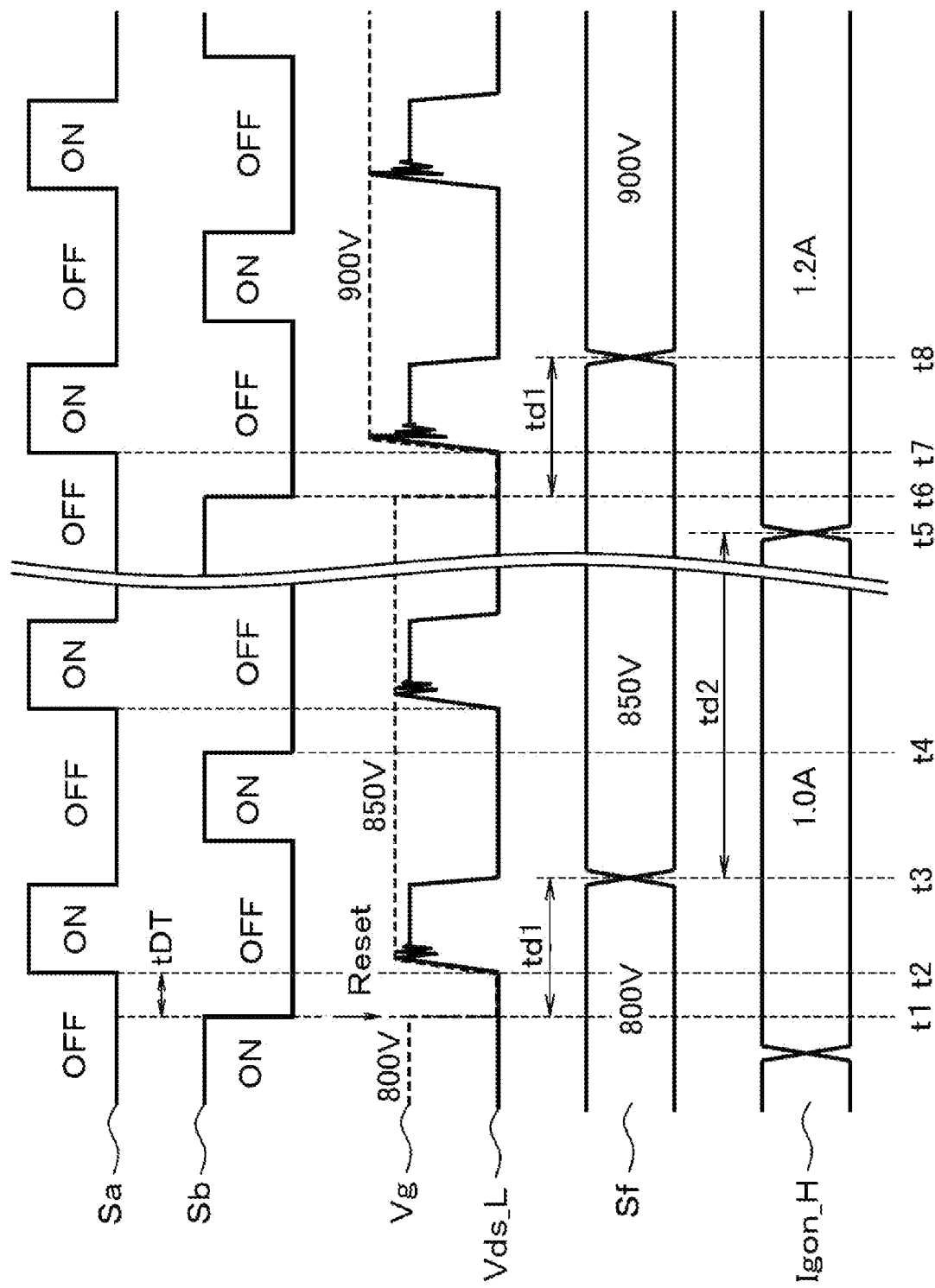
FIG. 6 is a timing chart for explaining a timing of each control through the gate drive apparatus according to a second embodiment.

The following describes a second embodiment with reference to FIG. 6. The second embodiment is different from the first embodiment in the timing of each control. Since the configuration of the second embodiment is identical to that of the first embodiment, the second embodiment is described with reference to, for example, FIG. 1. In this situation, the drive capability controllers 12, 15 respectively calculate the values of the drive capability at every period longer than the drive periods of the switching elements 5, 6, and respectively modify the drive capability. In this situation, the peak voltage detectors 11, 14 respectively detect the peak of the surge voltage generated at the time of turn-on every period longer than the driving periods of the switching elements 5, 6.

The timing of each control in the present embodiment is described with reference to the timing chart in FIG. 6. In this situation, the control before the time t3 is identical to the one in the first embodiment. However, in this situation, the time td2 is longer than the driving periods of the switching elements 5, 6, and is significantly longer as compared with the first embodiment. The time t5, which is the time td2 elapsed from the time t3, is the time at a driving period two times after the driving from the time t1 to time t4. The operation executed in the time t1 to time t5 is repeated after the time t6.

As described above, in the present embodiment, the peak of the surge voltage at the opposite arm is detected at the time of turning on the subject arm at the predetermined driving period. In the present embodiment, until the time t7 as the start of turning on the subject arm at a driving period, which is two periods after the predetermined driving period, the drive capability at the time of turning on the subject arm based on the detected value of the peak is calculated, and the calculated drive capability is actually reflected. In other words, in the present embodiment, the modification of the drive capability is executed once in three driving periods. The modification of the drive capability may be executed once in two driving periods, or the modification of the drive capability may be executed once in four driving periods.

According to the present embodiment with such control, the effect similar to the one in the first embodiment, in other words, the advantageous effect of suppressing the surge voltage without increasing the turn-on loss can be attained. It is possible to lengthen the time td2 in such control as compared with the control in the first embodiment. According to the present embodiment, since it is also applicable to an apparatus having lower responsiveness in each circuit affecting the time td2, the present embodiment has higher versatility.

Third Embodiment

Figure 7:
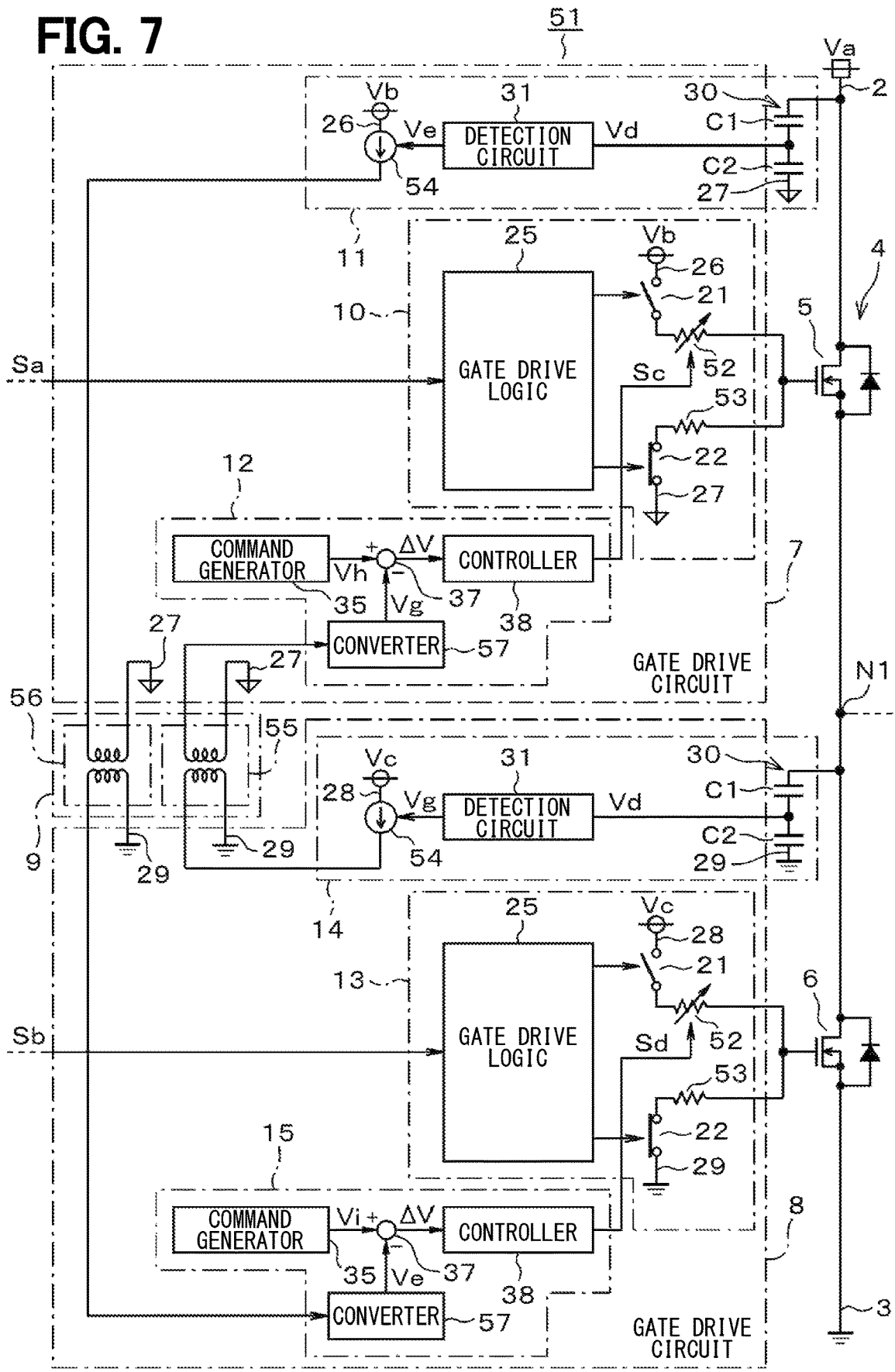
FIG. 7 schematically illustrates an example of the configuration of the gate drive apparatus according to a second embodiment.
Figure 8:
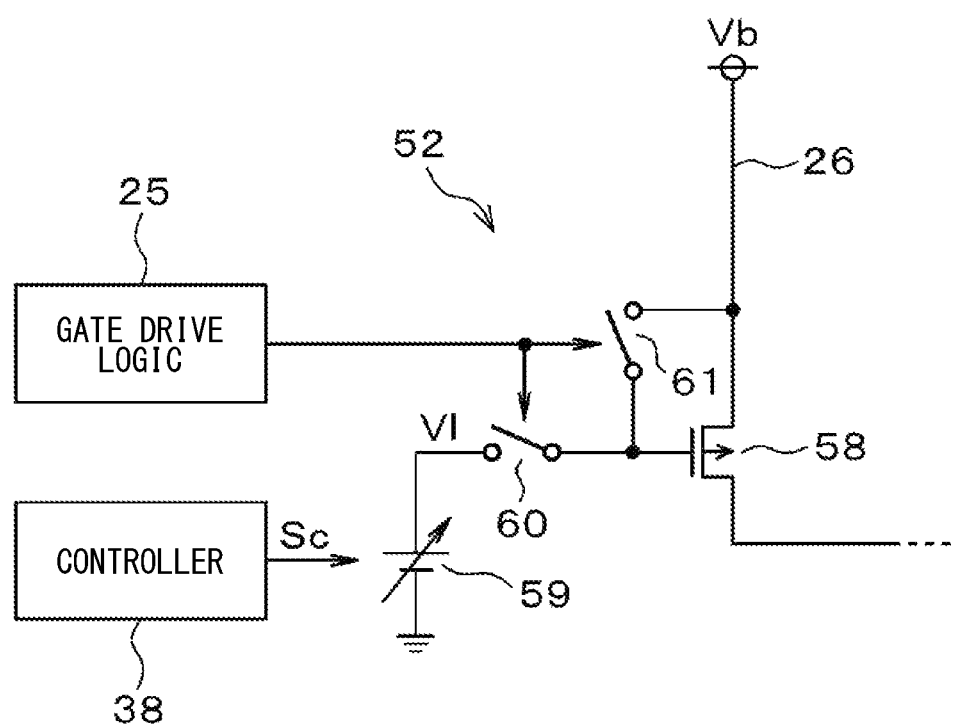
FIG. 8 schematically illustrates an example of the configuration of a drive at a turn-on side according to the third embodiment.

The following describes a third embodiment with reference to FIGS. 7, 8.

(Configuration of Gate Drive Apparatus)

The present embodiment is different from the first embodiment in the configuration of the gate drive apparatus. As illustrated in FIG. 7, a gate drive apparatus 51 according to the present embodiment is different from the gate drive apparatus 1 according to the first embodiment in FIG. 3 such that the configurations of the drivers 10, 13, the peak voltage detectors 11, 14, the drive capability controllers 12, 15 and the transmitter 9 are modified.

The driver 10 drives the gate of the switching element 5 with a constant voltage. In other words, the driver 10 includes switches 21, 22, resistors 52, 53, and a gate drive logic 25. The switch 21 opens or closes the path between the power supply line 26 and the upper stream terminal of the resistor 52. The lower stream terminal of the resistor 52 is connected to the gate of the switching element 5. The resistor 52 can modify the resistance value based on the capability setting signal Sc provided from the drive capability controller 12.

The switch 22 opens or closes the path between the downstream terminal of the resistor 53 and the power supply line 27. The upper stream terminal of the resistor 53 is connected to the gate of the switching element 5. In this situation, the resistor 53 has a constant resistance value. In the above configuration, the drive capability at a time of turning on the switching element 5 is modified by modifying the resistance value of the resistor 52 according to the capability setting signal Sc, in other words, the gate resistance at the time of turning on the switching element 5. The gate resistance at the time of turning on the switching element 5 is a total resistance including a wiring resistance of a path from the power supply line 26 to the gate of the switching element 5.

The driver 13, as similar to the driver 10, drives the gate of the switching element 6 with a constant voltage. With regard to the configuration of the driver 13, the description of the parts identical to the parts in the driver 10 is omitted. In this situation, the switch 21 opens or closes the path between the power supply line 28 and the upper stream terminal of the resistor 52. The switch 22 opens or closes the path between the downstream terminal of the resistor 53 and the power supply line 29.

In the above configuration, the drive capability at a time of turning on the switching element 5 is modified by modifying the resistance value of the resistor 52 according to the capability setting signal Sd, in other words, the gate resistance at the time of turning on the switching element 6. The gate resistance at the time of turning on the switching element 6 is a total resistance including a wiring resistance of a path from the power supply line 28 to the gate of the switching element 6.

The peak voltage detector 11 includes a voltage divider circuit 30, a detection circuit 31 and a current supply 54. In this situation, the voltage divider circuit 30 is disposed outside the gate drive circuit 7; in other words, outside the integrated circuit (IC). The upper stream terminal of the current supply 54 is connected to the power supply line 26. The current supply 54 outputs a current according to the detected voltage Ve provided from the detection circuit 31. The lower stream terminal of the current supply 54 is connected to the transmitter 9. According to the above configuration, the current supply 54 outputs the current having a current value according to the detected voltage Ve to the transmitter 9.

The peak voltage detector 14 has a configuration similar to the peak voltage detector 11. With regard to the configuration of the peak voltage detector 14, the description of the parts identical to the parts in the peak voltage detector 11 is omitted. In this situation, the upper stream terminal of the current supply 54 is connected to the power supply line 28. The current supply 54 outputs a current according to the detected voltage Vg provided from the detection circuit 31. The lower stream terminal of the current supply 54 is connected to the transmitter 9. According to the above configuration, the current supply 54 outputs the current having a current value according to the detected voltage Vg to the transmitter 9.

The transmitter 9 includes transformers 55, 56 corresponding to insulators. The respective transformers 55, 56 are disposed outside the gate drive circuits 7, 8, in other words, outside the integrated circuit (IC). One terminal of the primary coil in the transformer 55 is connected to the lower stream terminal of the current supply 54 of the peak voltage detector 14, and the other terminal of the primary coil is connected to the power supply line 29. One terminal of the secondary coil in the transformer 55 is connected to the drive capability controller 12 of the gate drive circuit 7, and the other terminal of the secondary coil is connected to the power supply line 27. According to the configuration, the transformer 55 blocks or transmits the current according to the detected voltage Vg output from the peak voltage detector 14 of the gate drive circuit 8 to the drive capability controller 12 of the gate drive circuit 7.

One terminal of the primary coil in the transformer 56 is connected to the lower stream terminal of the current supply 54 of the peak voltage detector 11, and the other terminal of the primary coil is connected to the power supply line 27. One terminal of the secondary coil in the transformer 56 is connected to the drive capability controller 15 of the gate drive circuit 8, and the other terminal of the secondary coil is connected to the power supply line 29. According to the configuration, the transformer 56 blocks or transmits the current according to the detected voltage Ve output from the peak voltage detector 11 of the gate drive circuit 7 to the drive capability controller 15 of the gate drive circuit 8.

The drive capability controller 12 includes a command generator 35, a converter 57, a subtractor 37 and a controller 38. The converter 57 is an I-V conversion circuit, and converts a current provided from the transmitter 9 to a voltage and then output the voltage. The voltage output from the converter 57 is identical to the detected voltage Vg output from the detection circuit 31 in the peak voltage detector 14. The drive capability controller 15 has a configuration identical to the drive capability controller 12. With regard to the configuration of the drive capability controller 15, the description of the parts identical to the parts in the drive capability controller 12 is omitted. In this situation, the voltage output from the converter 57 is identical to the detected voltage Ve output from the detection circuit 31 in the peak voltage detector 11.

(Configuration of Driver at Turn-On)

The following describes the configuration of the driver 10, 13 at turn-on by adopting, for example, the configuration illustrated in FIG. 8. Although FIG. 8 illustrates the configuration of the driver 10, it may also be applied to the driver 13. As illustrated in FIG. 8, in this situation, the resistor 52 includes, for example, a transistor 58, a voltage supply 59 and a switch 60. The transistor 58 is a P-channel type MOSFET. The source of the transistor 58 is connected to the power supply line 26. The drain of the transistor 58 is connected to the gate of the switching element 5. A switch 61 is connected between the source and gate of the transistor 58. The switch 61 has the function identical to the function of the switch 21. However, the on/off relation of the switch 46 is opposite to the on/off relation of the switch 21.

The voltage supply 59 is a variable voltage supply, and outputs a voltage having a voltage value corresponding to the capability setting signal Sc provided from the controller 38. The voltage Vl output from the voltage supply 59 is provided to the gate of the transistor 58 through the switch 60. The gate drive logic 25 complementarily turns on or off the switches 60, 61. According to the above configuration, in a situation where the switch 61 is turned on, the transistor 58 is fixed to an off state so that the switching element 5 cannot be turned on. At the time of turning on the switching element 5, a signal for instructing the switch 61 to turn on is provided from the gate drive logic 25.

According to the above configuration, in a situation where the switch 61 is turned off and the switch 60 is turned on, the voltage output from the voltage supply 59 is provided to the gate of the transistor 58 and drives the transistor 58 to be at the on state. At the time of turning on the switching element 5, a signal for instructing the switch 60 to turn on is provided from the gate drive logic 25. As a result, the gate voltage of the transistor 58 is controlled by the voltage Vl based on the capability setting signal Sc output from the controller 38. As a result, the on-state, in other words, the on-resistance of the transistor 58 is controlled to a desired resistance value, and the gate resistance at the time of turning on the switching element 5 is controlled to a desired resistance value.

According to the configuration of the present embodiment described above, it is possible to optimize the driving capability at the time of turning on the drivers 10, 13. Therefore, the effect similar to the one in the first embodiment, in other words, the advantageous effect of suppressing the surge voltage without increasing the turn-on loss can be attained. In the present embodiment, the divider circuit 30 and the transformers 55, 56 are respectively provided outside the gate drive circuits 7, 8 as the integrated circuits. In other words, in the present embodiment, the configuration in which a relatively high voltage required for insulation, voltage division or the like is provided outside the gate drive circuit 7, 8. According to such a configuration, since it is possible to provide the gate drive circuit 7, 8 without adopting, for example, an element with a higher withstand voltage, it is possible to miniaturize the gate drive apparatus 51 while reducing the manufacturing cost or the like.

According to the above configuration, the peak voltage detectors 11, 14 respectively convert the detected voltages Ve, Vg to the currents and output the converted currents. The transmitter 9 transmits the respective currents through the transformers 55, 56 to the drive capability controllers 12, 15. According to the configuration of transmitting the detected peak value of the surge voltage with the current as an analog value, it is possible to enhance the responsiveness of the transmission of the detected value. According to the configuration of transmitting the detected peak value of the surge voltage with the current, it is possible to enhance the precision in transmitting the detected value since the configuration is not affected by a tolerance error in the power supply during insulation.

In the present embodiment, the drive capability controllers 12, 15 respectively modify the drive capability of the drivers 10, 13 through modifying the gate resistance at the time of turning on the switching elements 5, 6. In the present embodiment, the gate resistance is modified by modifying the voltage applied to the gate of the transistor 58 interposed between the power supply lines 26, 28 and the switching elements 5, 6 in series. In this situation, the transistor 58 functions as the switch and the gate resistance. According to such a configuration, it is possible to modify the drive capability at the time of turning on the drivers 10, 13 in higher precision, and it is possible to execute the above surge voltage with higher precision.

Fourth Embodiment

Figure 9:
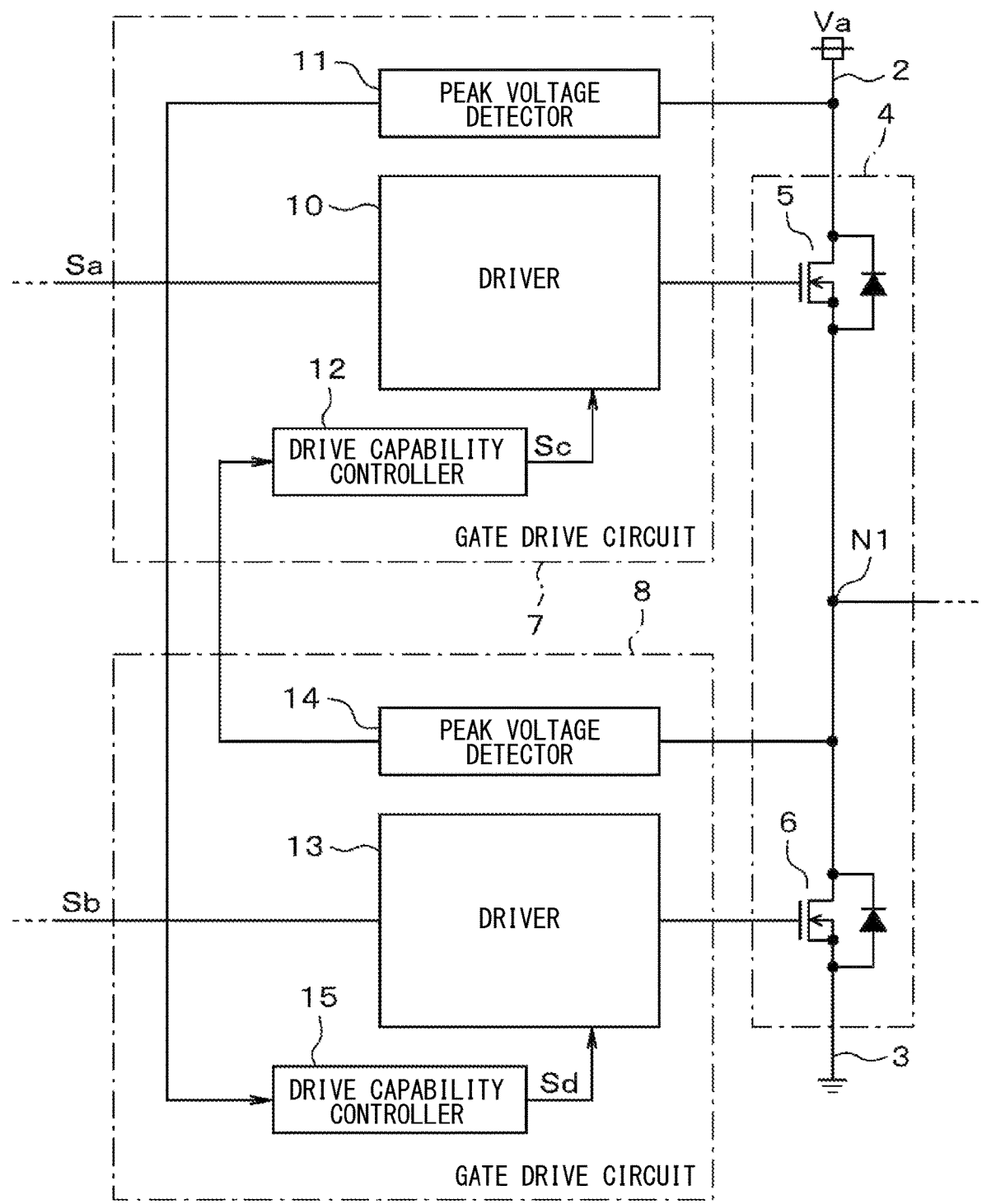
FIG. 9 schematically illustrates the configuration of a gate drive apparatus according to a fourth embodiment.
Figure 10:
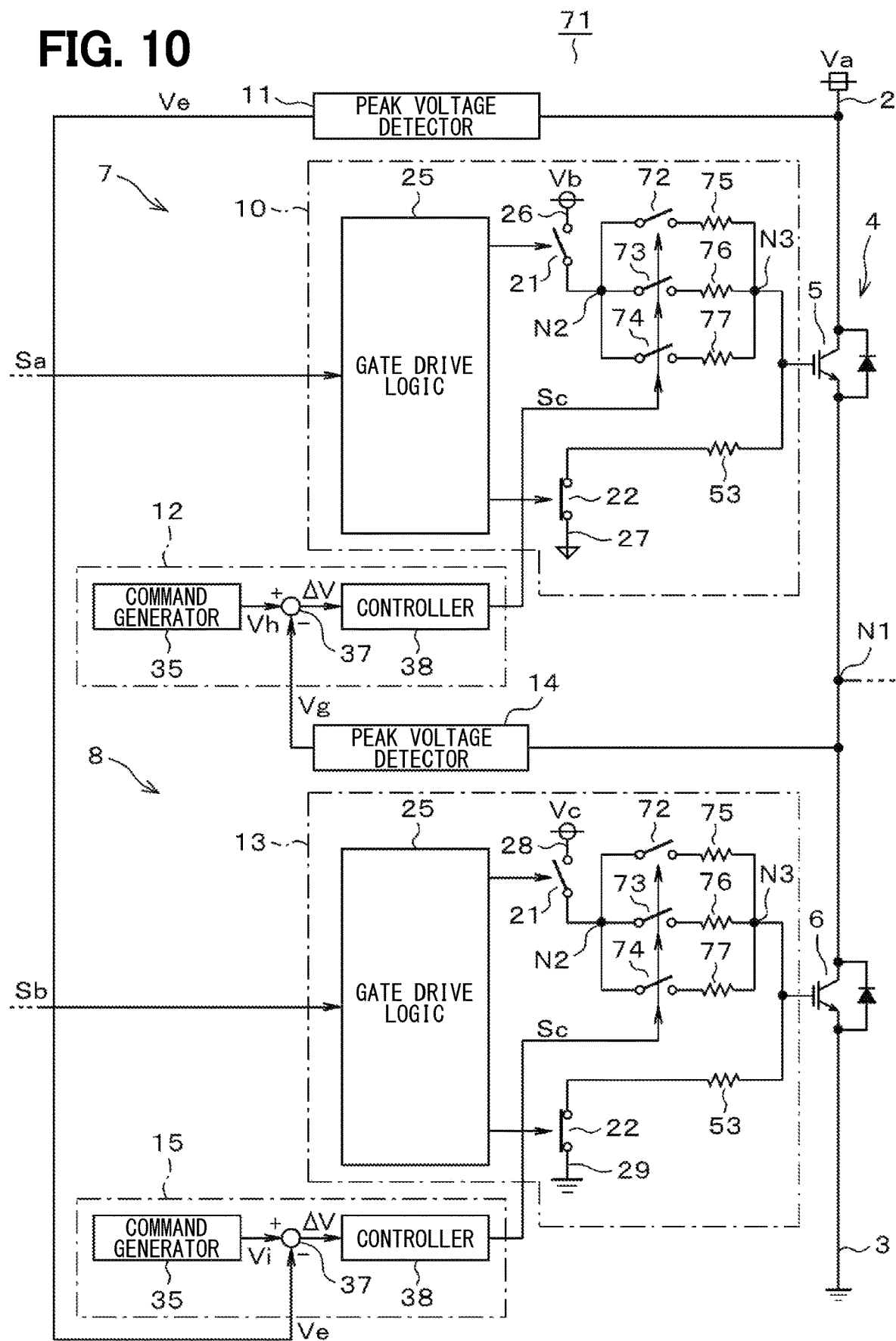
FIG. 10 schematically illustrates an example of the configuration of the gate drive apparatus according to a fourth embodiment.

The following describes a fourth embodiment with reference to FIGS. 9, 10.

(Configuration of Gate Drive Apparatus)

As illustrated in FIG. 9, a gate drive apparatus 71 in the present embodiment is different from the gate drive apparatus 1 in the first embodiment such that the transmitter 9 is omitted. In this situation, the gate drive circuits 7, 8 are provided as an identical device, in particular, an identical integrated circuit (IC).

(Configuration of Gate Drive Apparatus)

The following describes the configuration of the gate drive apparatus 71 by adopting, for example, the configuration illustrated in FIG. 10. In the example of configuration illustrated in FIG. 10, each of the switching elements 5, 6 to be driven includes an IGBT and a reflux diode. The reflux diode is connected between the collector and emitter of the IGBT. The anode of the reflux diode faces the emitter of the IGBT. In other words, the reflux diode is connected to the IGBT in antiparallel.

The driver 10 drives the gate of the switching element 5 with a constant voltage. In other words, the driver 10 includes switches 21, 22, switches 72 to 74, resistors 75 to 77, and a gate drive logic 25. The switch 21 opens or closes the path between the power supply line 26 and the node N2. A node N3 is connected to the gate of the switching element 5. The series circuit having the switch 72 and the resistor 75, the series circuit having the switch 73 and the resistor 76, and the series circuit having the switch 74 and the resistor 77 are connected to each other in parallel between the nodes N2 and N3. The switch 22 opens or closes the path between the downstream terminal of the resistor 53 and the power supply line 27.

According to the above configuration, the switches 72 to 74 are turned on or off according to the capability setting signal Sc. Therefore, the gate resistance at the time of turning on the switching element 5 is modified to a desired value, and then the drive capability at the time of turning on is modified to a desired value. In the present embodiment, the switches 72 to 74, the resistors 75 to 77 and the resistor 53 are provided outside the gate drive circuits 7, 8, in other words, outside the integrated circuit. The switches 72 to 74, the resistors 75 to 77 and the resistor 53 may be provided inside the integrated circuit.

The driver 13, as similar to the driver 10, drives the gate of the switching element 6 with a constant voltage. With regard to the configuration of the driver 13, the description of the parts identical to the parts in the driver 10 is omitted. The node N3 is connected to the gate of the switching element 6. According to the above configuration, the switches 72 to 74 are turned on or off according to the capability setting signal Sd. Therefore, the gate resistance at the time of turning on the switching element 6 is modified to a desired value, and then the drive capability at the time of turning on is modified to a desired value.

The peak voltage detectors 11, 14 respectively has a configuration identical to the detection circuit 31 described in, for example, the first embodiment. That is, the peak voltage detectors 11 and 14 are provided as a peak hold circuit. The peak voltage detector 11 receives an input of the collector voltage of the switching element 5, and outputs the peak hold voltage Ve for maintaining the peak of the input voltage, in other words, the detected voltage Ve. The peak voltage detector 14 receives an input of the collector voltage of the switching element 6, and outputs the peak hold voltage Vg for maintaining the peak of the input voltage, in other words, the detected voltage Vg.

Both of the drive capability controllers 12 and 15 include a command generator 35, a subtractor 37 and a controller 38. In this situation, the subtractor 37 of the drive capability controller 12 acquires deviation $\Delta V$ by subtracting the detected voltage Vg output from the peak voltage detector 14 from the command voltage Vf output from the command generator 35. Therefore, the deviation $\Delta V$ is output to the controller 38. In this situation, the subtractor 37 of the drive capability controller 15 acquires deviation $\Delta V$ by subtracting the detected voltage Ve output from the peak voltage detector 11 from the command voltage Vi output from the command generator 35. Therefore, the deviation $\Delta V$ is output to the controller 38.

According to the configuration of the present embodiment described above, it is possible to optimize the driving capability at the time of turning on the drivers 10, 13. Therefore, the effect similar to the one in the first embodiment, in other words, the advantageous effect of suppressing the surge voltage without increasing the turn-on loss can be attained. In the present embodiment, the gate drive circuits 7, 8 are provided as an identical device. Therefore, the configuration for transmitting the detected voltages Ve, Vg between the gate drive circuits 7 and 8 is not required. The gate drive apparatus 71 cannot be applied to an application having a relatively high power supply voltage Va; however, it can be applied to an application having a relatively low power supply voltage Va. The configuration related to the present embodiment is optimal for a so-called low voltage system.

In the configuration of the present embodiment, the insulation is not required for transmitting the detected voltages Ve, Vg. Therefore, it is possible to attain control with higher responsiveness. In the present embodiment, the drive capability controllers 12, 15 respectively modify the drive capability of the drivers 10, 13 through modifying the gate resistance at the time of turning on the switching elements 5, 6. The present embodiment provides the resistors 75 to 77 for making a series connection between the power supply line 28 and the switching elements 5, 6. In the present embodiment, the gate resistance is modified by switching the number of connections. According to such a configuration, it is possible to modify the drive capability at the time of turning on the drivers 10, 13 in higher precision, and it is possible to execute the above surge voltage with higher precision.

Fifth Embodiment

Figure 11:
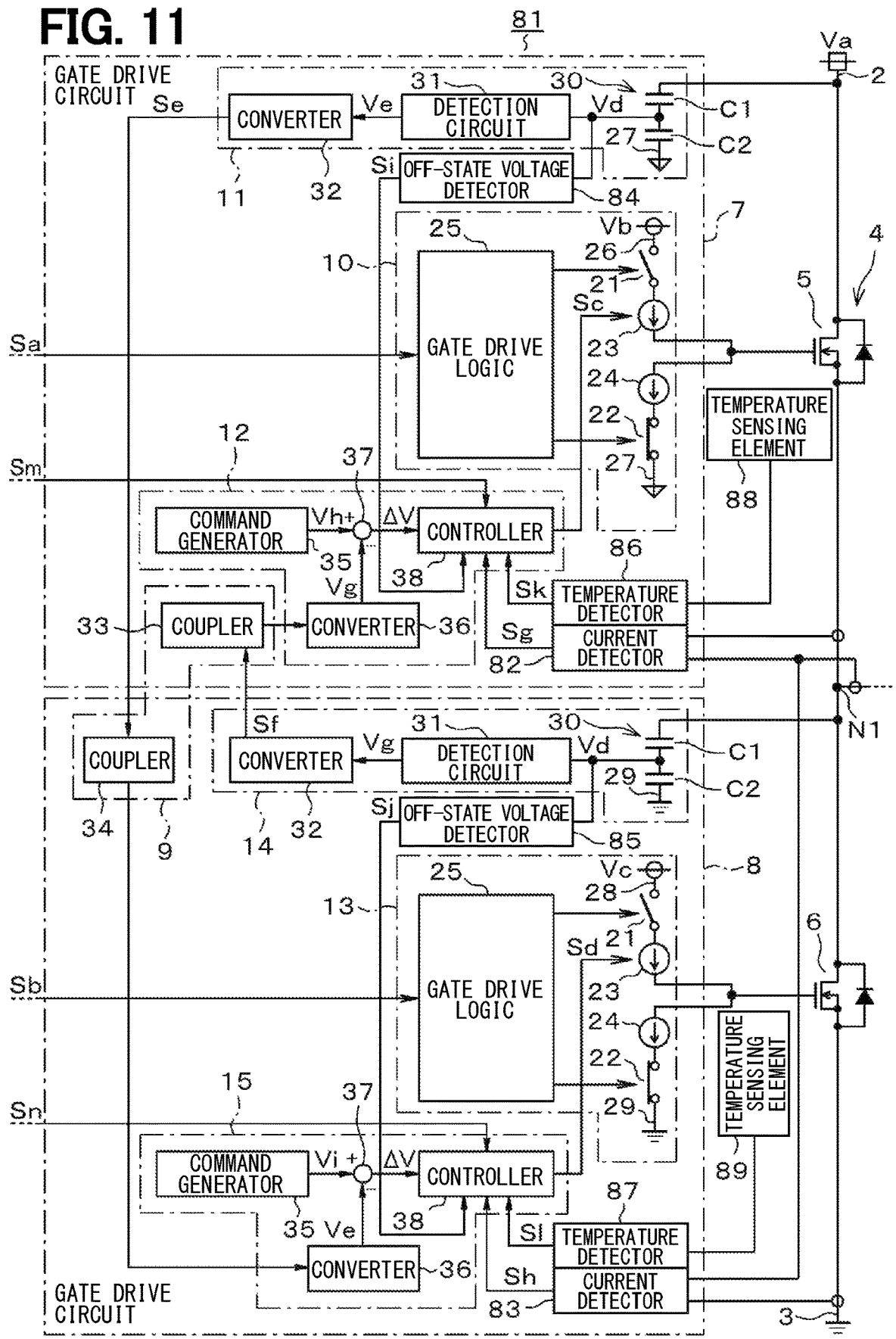
FIG. 11 schematically illustrates an example of the configuration of the gate drive apparatus according to a fifth embodiment.

The following describes a fifth embodiment with reference to FIG. 11.

In a situation where the switching elements 5, 6 are driven by the predetermined drive capability, the surge voltage changes in response to a change in the current flowing through the load, in other words, the main circuit current. In a situation where the drive capability is constant, the peak of the surge voltage rises with an increase in the load current, and the peak of the surge voltage drops with a decrease in the load current. The current flowing through the switching elements 5, 6, in other words, the element current is identical to the main circuit current.

In a situation where the switching elements 5, 6 are driven by the predetermined drive capability, the surge voltage changes in response to a change in the system voltage, in other words, the power supply voltage Va. In a situation where the drive capability is constant, the peak of the surge voltage rises with an increase in the power supply voltage Va, and the peak of the surge voltage drops with a decrease in the power supply voltage Va. An off-state voltage is a voltage applied to the main terminals of the switching elements 5, 6 at the time of turning off the switching elements 5, 6. The off-state voltage, in other words, the voltage VDS between the drain and source of the switching elements 5, 6 at the time of turning off the switching elements 5, 6 is identical to the power supply voltage Va. In general, the element withstand voltage of the switching elements 5 and 6, in other words, the surge withstand depends on the element temperature as the temperature of the switching element. The element withstand voltage rises as the element temperature rises, and the element withstand voltage drops as the element temperature drops.

In a state where the drive capability is optimized, the surge voltage rises along with a change in, for example, the main circuit current, the element current, the power supply voltage Va, the off-state voltage, and the element temperature, the voltage exceeding the element withstand may be applied to the main terminals of the switching elements 5, 6. In a state where the drive capability is optimized, when the surge voltage drops along with a change in, for example, the main circuit current, the element current, the power supply voltage Va, the off-state voltage and the element temperature, the drive capability is set lower than necessary. Thus, the switching loss increases according to the margin. The following describes countermeasures against the above described difficulties.

The present embodiment is different from the first embodiment in the configuration of the gate drive apparatus. As illustrated in FIG. 11, a gate drive apparatus 81 according to the present embodiment is different from the gate drive apparatus 1 according to the first embodiment illustrated in FIG. 3 such that the gate drive apparatus 81 also includes, for example, current detectors 82, 83, an off-state voltage detectors 84, 85, temperature detectors 86, 87. Each of the current detectors 82, 83, the off-state voltage detectors 84, 85 and the temperature detectors 86, 87 corresponds to a detector.

The current detector 82 is provided inside the gate drive circuit 7, and detects at least one of the main circuit current flowing between the node N1 and the load (not shown) and the element current flowing between the source of the switching element 5 and the node N1. The current detector 82 outputs the detected signal Sg indicating the detected value to the controller 38 of the drive capability controller 12. The current detector 83 is provided inside the gate drive circuit 8, and detects at least one of the main circuit current and the element current flowing between the source of the switching element 6 and the direct current power supply line 3. The current detector 83 outputs the detected signal Sh indicating the detected value to the controller 38 of the drive capability controller 15.

The off-state voltage detector 84 is provided inside the gate drive circuit 7. The off-state voltage detector 84 detects the off-state voltage based on the divided voltage Vd divided through the divider circuit 30 of the peak voltage detector 11, and outputs the detected signal Si indicating the detected value to the controller 38 of the drive capability controller 12. The off-state voltage detector 85 is provided inside the gate drive circuit 8. The off-state voltage detector 85 detects the off-state voltage based on the divided voltage Vd divided through the divider circuit 30 of the peak voltage detector 14, and outputs the detected signal Si indicating the detected value to the controller 38 of the drive capability controller 15.

The temperature detector 86 is provided inside the gate drive circuit 7. The temperature detector 86 detects the element temperature of the switching element 5 based on a change in the terminal voltage of a temperature sensing element 88 including, for example, a diode provided around the switching element 5. The temperature detector 86 outputs the detected signal Sk indicating the detected value to the controller 38 of the drive capability controller 12. The temperature detector 87 is provided inside the gate drive circuit 8. The temperature detector 87 detects the element temperature of the switching element 6 based on a change in the terminal voltage of a temperature sensing element 89 including, for example, a diode provided around the switching element 6. The temperature detector 87 outputs the detected signal Sl indicating the detected value to the controller 38 of the drive capability controller 15.

In this situation, the detected signal Sm indicating the detected value of the power supply voltage Va from outside is sent to the gate drive apparatus 81. The detected signal Sm is output from, for example, a voltage detection circuit for detecting the power supply voltage Va provided outside the gate drive apparatus 81 and a host controller for the gate drive apparatus 81. The detected signal Sm is provided to the controller 38 of the drive capability controllers 12, 15.

In addition to a variety of the controls described in, for example, the first embodiment, the drive capability controllers 12, 15 respectively execute control for correcting the calculated results of drive capability at the time of turning on based on the detected result of each of the detectors. The drive capability controllers 12, 15 correct the value of the drive capability to be smaller in a situation where the main circuit current or the element current changes in an increasing direction, and correct the value of the drive capability to be larger in a situation where the main circuit current or the element current changes in a decreasing direction.

The drive capability controllers 12, 15 correct the value of the drive capability to be smaller in a situation where the off-state voltage or the power supply voltage Va changes in an increasing direction, and correct the value of the drive capability to be larger in a situation where the off-state voltage or the power supply voltage Va changes in an decreasing direction. The drive capability controllers 12, 15 correct the value of the drive capability to be smaller in a situation where the sensing temperature changes in a lowering direction, and correct the value of the drive capability to be larger in a situation where the sensing temperature changes in a rising direction.

As described above, the drive capability controllers 12, 15 included in the gate drive apparatus 81 according to the present embodiment corrects the calculated result of the value of drive capability based on each detected value of the main circuit current, the element current, the off-state voltage, the power supply voltage Va, and the element temperature. Even though the main circuit current, the element current, the off-state voltage, the power supply voltage Va and the element temperature change, it is possible to optimize the drive capability of the drivers 10, 13 in consideration of these changes, in other words, disturbances. According to the present embodiment, it is possible to suppress the surge voltage without increasing the switching loss, regardless of a change in, for example, the main circuit current, the element current, the off-state voltage, the power supply voltage Va and the element temperature.

The gate drive apparatus 81 corrects the calculated result of the value of drive capability based on at least one of the detected value of the off-state voltage and the detected value of the power supply voltage Va. The following describes advantageous effects in a situation of correcting the calculated result of the value of drive capability based on the detected value of the off-state voltage. In other words, the off-state voltage detectors 84, 85 detect the off-state voltage based on the divided voltage Vd divided through the divider circuit 30 originally provided. According to the above configuration, it is not required to provide a terminal specialized for detecting the off-state voltages of the off-state voltage detectors 84, 85. Thus, it is possible to miniaturize the gate drive circuits 7, 8.

The following describes advantageous effects in a situation of correcting the calculated result of the value of drive capability based on the detected value of the power supply voltage Va. The power supply voltage Va is different from the off-state voltage, which can be detected only when the switching elements 5, 6 are turned off. The power supply voltage Va can be detected on a steady basis based on the detected signal Sm. Therefore, the advantageous effect of without having a restriction to a timing for executing correction based on the detected value of the power supply voltage Va can be attained.

The gate drive apparatus 81 corrects the calculated result of the value of drive capability based on each detected value of at least of the main circuit current and the element current, at least one of the off-state voltage and the power supply voltage Va, and the element temperature. However, the gate drive apparatus corrects the calculated result of the value of drive capability based on at least one of these detected values. In this situation, for each of the detectors, only the configuration required for executing the correction may remain, and other detectors may be omitted. According to such a configuration, it is possible to suppress the surge voltage without increasing the switching loss, regardless of at least one of the changes in the main circuit current, the element current, the off-state voltage, the power supply voltage Va and the element temperature.

Sixth Embodiment

Figure 12:
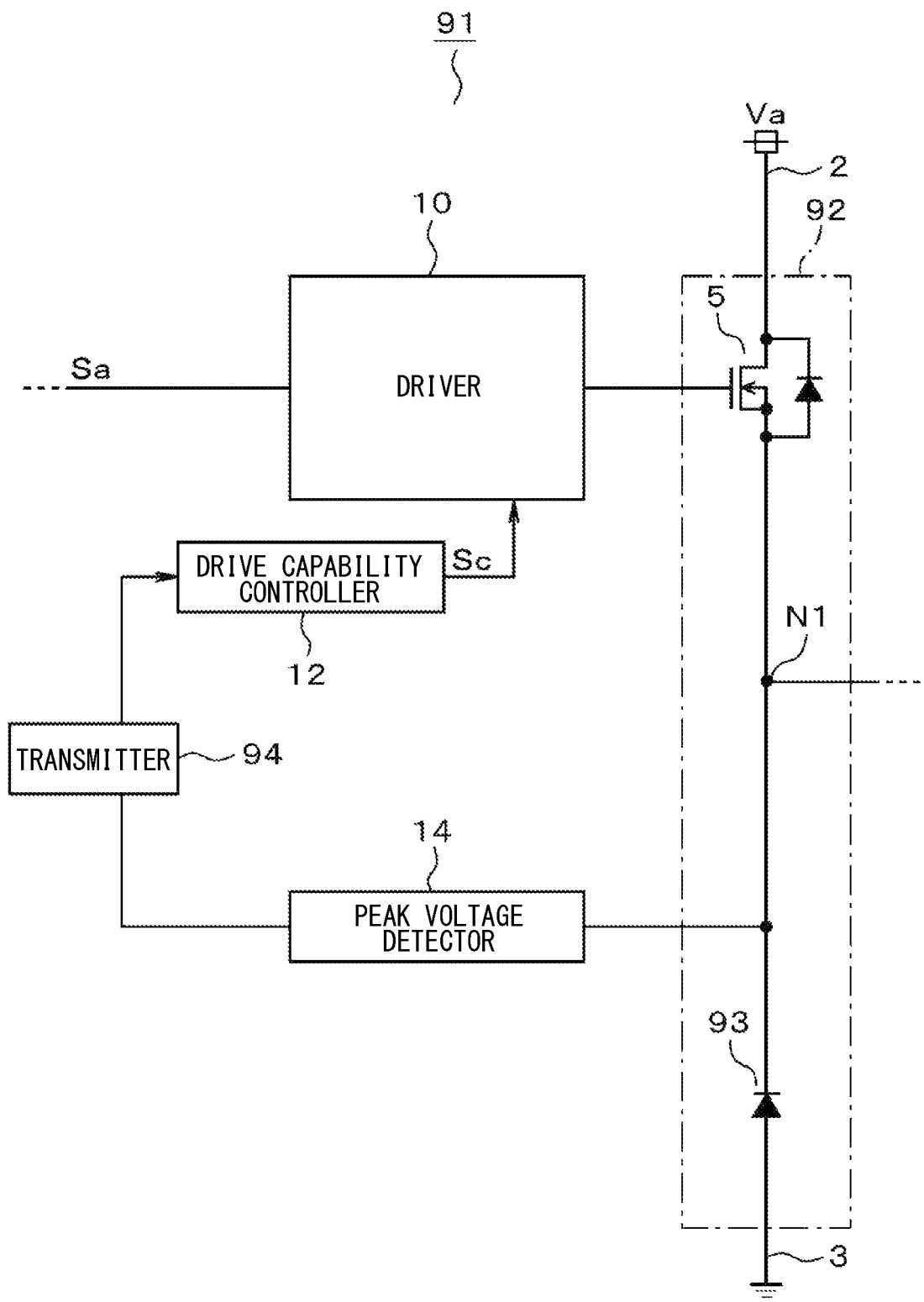
FIG. 12 schematically illustrates the configuration of a gate drive apparatus according to a sixth embodiment.
Figure 13:
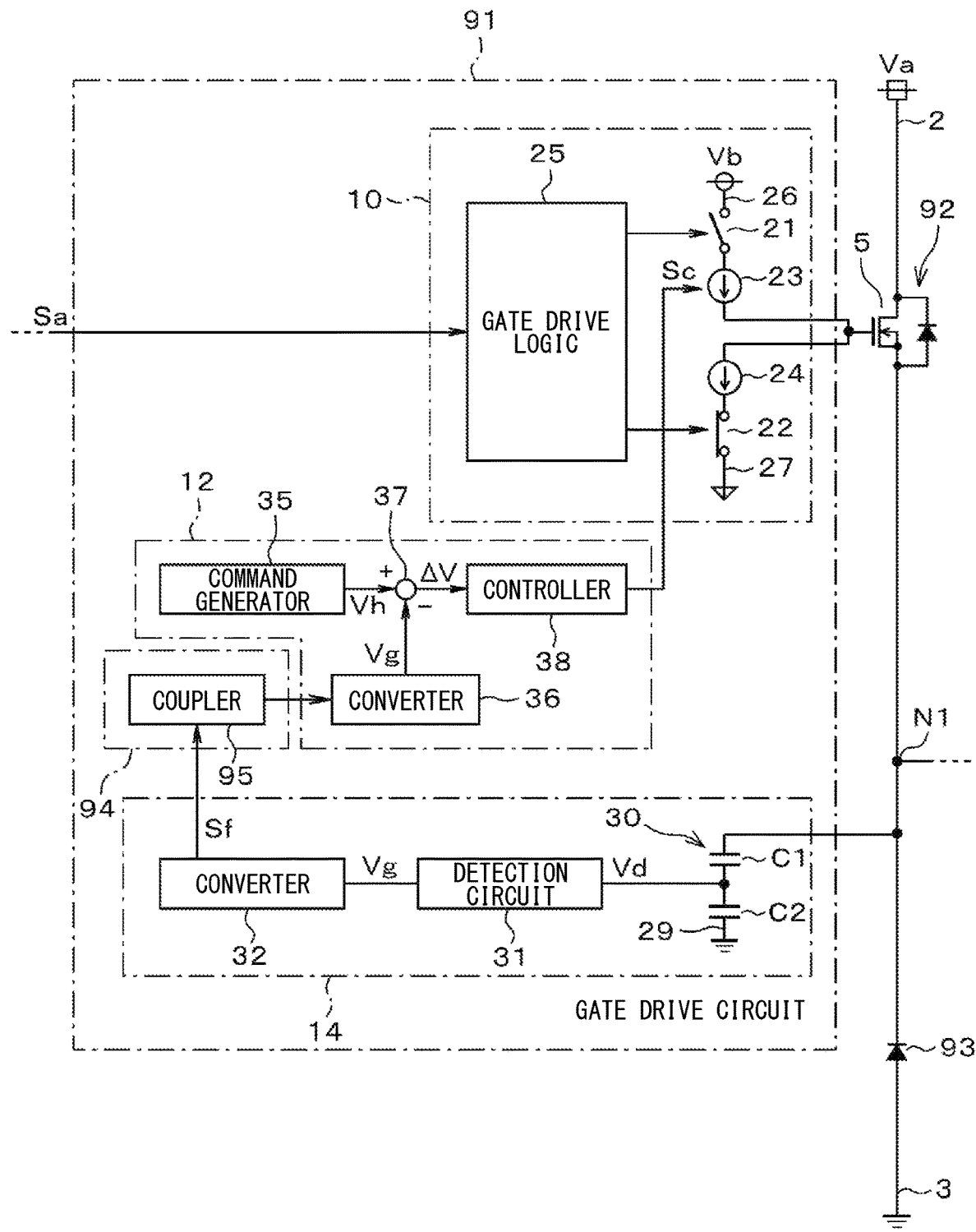
FIG. 13 schematically illustrates an example of the configuration of the gate drive apparatus according to the sixth embodiment.

The following describes a sixth embodiment with reference to FIGS. 12, 13.

(Configuration of Gate Drive Apparatus)

As illustrated in FIG. 12, a gate drive apparatus 91 according to the present embodiment drives two switching elements 5, 93. The switching elements 5, 6 are respectively included in an upper arm and a lower arm in a half-bridge circuit 92 connected between direct current power supply lines 2, 3. The switching elements 5, 93 may also be referred to as switching devices. In this situation, the switching element 5 as one of the switching elements includes a MOSFET as identical to the configuration shown in, for example, FIG. 1, and the switching element 93 as the other one of the switching elements includes a diode. The switching element 5 may include an IGBT, as identical to the configuration illustrated in, for example, FIG. 3. The half-bridge circuit 92 in the above configuration may be applied to a buck converter.

The gate drive apparatus 91 includes the driver 10, the drive capability controller 12 and the peak voltage detector 14 in the configuration shown in, for example, FIG. 1, and a transmitter 94. The peak voltage detector 14 detects the peak voltage of the main terminal of the switching element 93 at the time of turning on the switching element 5. In this situation, the peak voltage at the main terminal of the switching element 93 is the peak of the cathode voltage of the switching element 93 with reference to the potential at the direct current power supply line 3, in other words, the peak of the inter-terminal voltage of the switching element 93. The peak voltage detector 14 outputs the detected value of the peak voltage to the transmitter 94. The transmitter 94 transmits the detected value of the peak voltage detected by the peak voltage detector 14 to the drive capability controller 12. The transmitter 94 transmits the detected value of the peak voltage detector 14 through an insulator identical to the transmitter in, for example, the first embodiment.

(Configuration of Gate Drive Apparatus)

The following describes the configuration of the gate drive apparatus 91 by adopting, for example, the configuration illustrated in FIG. 13. As illustrated in FIG. 13, the driver 10, the drive capability controller 12 and the peak voltage detector 14 included in the gate drive apparatus 91 according to the present embodiment respectively have configurations similar to the ones illustrated in, for example, FIG. 3. The transmitter 94 has a magnetic coupler 95. The magnetic coupler 95 corresponds to an insulator, and insulates or transmits a pulse signal Sf output from the peak voltage detector 14 to the drive capability controller 12.

According to the configuration of the present embodiment described above, it is possible to optimize the driving capability at the time of the driver 10 turning on the switching element 5. Even when the gate drive apparatus 91 according to the present embodiment is applied to a buck converter as a system including upper and lower arms respectively having the switching elements 5, 93 being different to each other, the advantageous effect identical to the one in the first embodiment, in other words, the effect of suppressing the surge voltage without increasing the turn-on loss can be attained.

Seventh Embodiment

Figure 14:
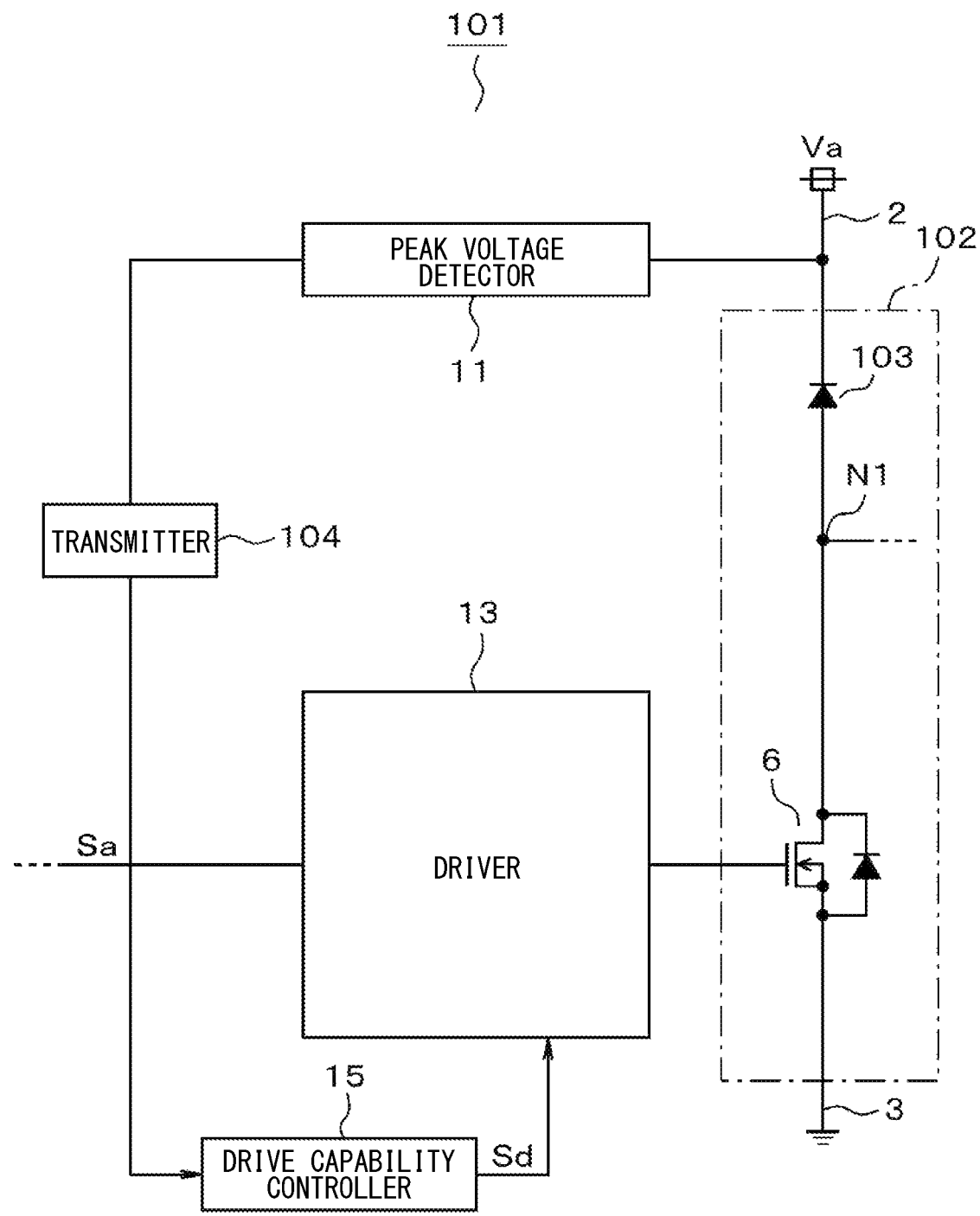
FIG. 14 schematically illustrates the configuration of a gate drive apparatus according to a seventh embodiment.

The following describes a seventh embodiment with reference to FIG. 14.

(Configuration of Gate Drive Apparatus)

As illustrated in FIG. 14, a gate drive apparatus 101 according to the present embodiment drives two switching elements 103, 6. The switching elements 103, 6 are respectively included in an upper arm and a lower arm in a half-bridge circuit 102 connected between direct current power supply lines 2, 3. The switching elements 103, 6 may also be referred to as switching devices. In this situation, the switching element 6 as one of the switching elements includes a MOSFET as identical to the configuration shown in, for example, FIG. 1, and the switching element 103 as the other one of the switching elements includes a diode. The switching element 6 may include an IGBT, as identical to the configuration illustrated in, for example, FIG. 3. The half-bridge circuit 102 in the above configuration may be applied to a boost converter.

The gate drive apparatus 101 includes the peak voltage detector 11, the driver 13 and the drive capability controller 15 in the configuration shown in, for example, FIG. 1, and a transmitter 104. The peak voltage detector 11 detects the peak voltage of the main terminal of the switching element 103 at the time of turning on the switching element 6. In this situation, the peak voltage at the main terminal of the switching element 103 is the peak of the cathode voltage of the switching element 103 with reference to the potential at the node N1, in other words, the peak of the inter-terminal voltage of the switching element 103. The peak voltage detector 11 outputs the detected value of the peak voltage to the transmitter 104. The transmitter 104 transmits the detected value of the peak voltage detected by the peak voltage detector 11 to the drive capability controller 15. The transmitter 104 transmits the detected value of the peak voltage detector 11 through an insulator identical to the transmitter 9 in, for example, the first embodiment.

(Configuration of Gate Drive Apparatus)

The following describes the configuration of the gate drive apparatus 101 by adopting the following configuration. The driver 13, the drive capability controller 15 and the peak voltage detector 11 included in the gate drive apparatus 101 according to the present embodiment respectively have configurations similar to the ones illustrated in, for example, FIG. 3. The transmitter 104 may adopt a configuration that insulates or transmits the pulse signal Se output from the peak voltage detector 11 to the drive capability controller 15 through a magnetic coupler corresponding to an insulator.

According to the configuration of the present embodiment described above, it is possible to optimize the driving capability at the time of turning on the driver 13. Even when the gate drive apparatus 101 according to the present embodiment is applied to a boost converter as a system including upper and lower arms respectively having the switching elements 103, 6 being different to each other, the advantageous effect identical to the one in the first embodiment, in other words, the effect of suppressing the surge voltage without increasing the turn-on loss can be attained.

Eighth Embodiment

Figure 15:
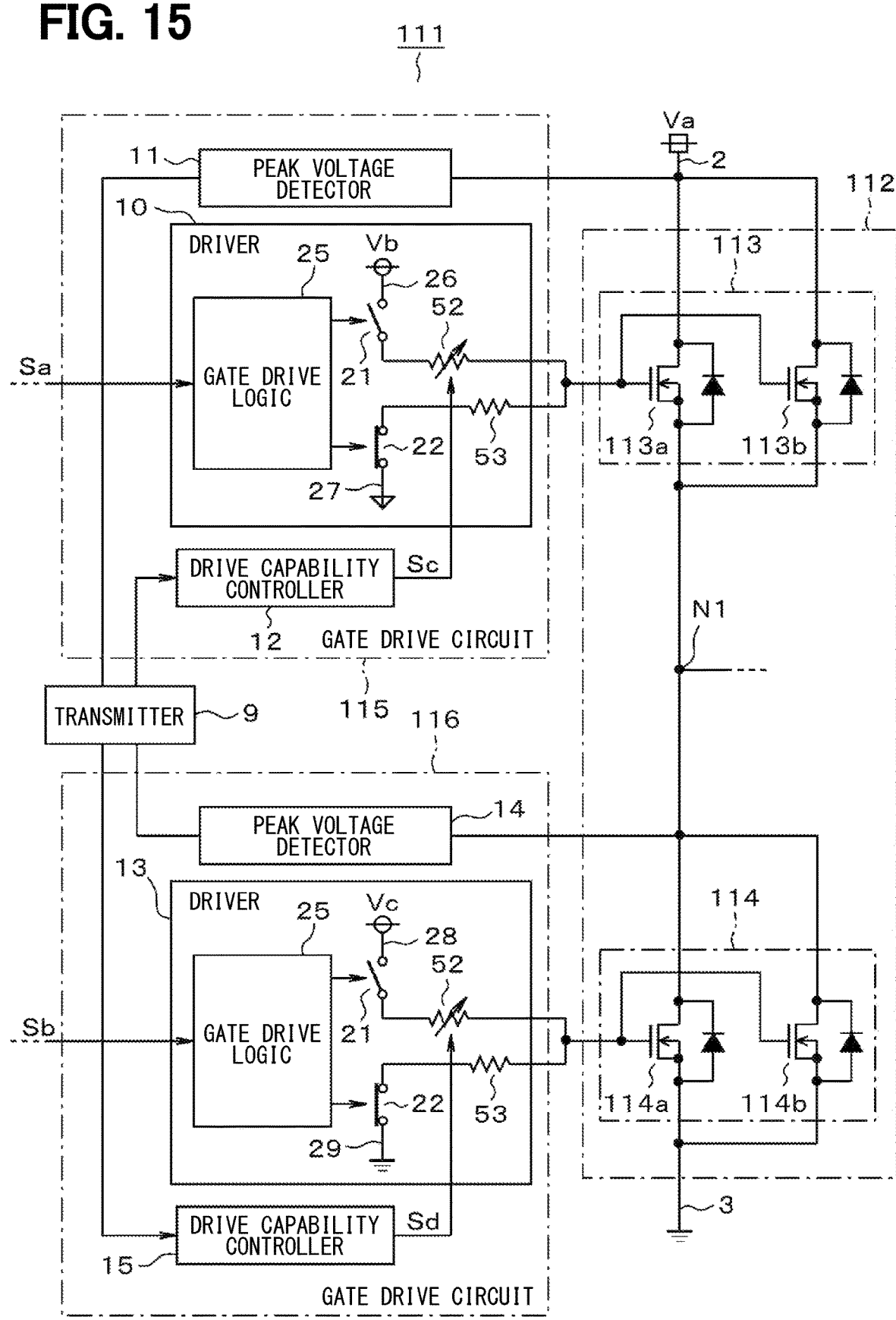
FIG. 15 schematically illustrates the configuration of a gate drive apparatus according to an eighth embodiment.

The following describes an eighth embodiment with reference to FIG. 15. As illustrated in FIG. 15, a gate drive apparatus 111 according to the present embodiment drives two switching elements 113, 114. The switching elements 113, 114 are respectively included in an upper arm and a lower arm in a half-bridge circuit 112 connected between direct current power supply lines 2, 3. The switching elements 113, 114 may also be referred to as switching devices. Each of the switching elements 113, 114 has two elements or devices with identical types which are connected in parallel. The switching elements 113, 114 may also have multiple elements or devices with identical types which are connected in parallel. For example, the switching elements 113, 114 may have three or more elements or devices with identical types which are connected in parallel.

The switching element 113 has two power elements 113a, 113b which are connected in parallel. The power elements 113a, 113b may also be referred to as power devices. The power elements 113a, 113b respectively have a configuration identical to the switching element 5 as illustrated in, for example, FIG. 1, in other words, the MOSFET. The switching element 114 has two power elements 114a, 114b which are connected in parallel. The power elements 114a, 114b may also be referred to as power devices. The power elements 114a, 114b respectively have a configuration identical to the switching element 6 as illustrated in, for example, FIG. 1, in other words, the MOSFET. The power elements 113a, 113b, 114a, 114b may include an IGBT, as identical to the configuration illustrated in, for example, FIG. 3.

The gate drive apparatus 111 includes gate drive circuits 115, 116 and a transmitter 9. The gate drive circuits 115, 116 respectively have a configuration identical to the gate drive circuits 7, 8 in each of the above embodiments. In this situation, the driver 10 included in the gate drive circuit 115 drives the configuration identical to the driver 10 shown in FIG. 7, in other words, the gate of the switching element 113 with a constant voltage. In this situation, the driver 13 included in the gate drive circuit 116 drives the configuration identical to the driver 13 shown in FIG. 7, in other words, the gate of the switching element 114 with a constant voltage.

In this situation, the gate signal provided from the driver 10 to the gate of the switching element 113 is branched into multiple signals near the switching element 113 from the downstream terminals of the resistors 52, 53, and the identical gate signal is transmitted to the gate of each of the power elements 113a, 113b. The driver 10 drives the power elements 113a, 113b together. In this situation, the gate signal provided from the driver 13 to the gate of the switching element 114 is branched into multiple signals near the switching element 114 from the downstream terminals of the resistors 52, 53, and the identical gate signal is transmitted to the gate of each of the power elements 114a, 114b. The driver 13 drives the power elements 114a, 114b together.

In the above configuration, each gate resistance at the time of turning on the power elements 113a, 113b, in other words, each drive capability at the time of turning on the power elements 113a, 113b is modified to be identical by modifying the resistance value of the resistor 52 in response to the capability setting signal Sc. In the above configuration, each gate resistance at the time of turning on the power elements 114a, 114b, in other words, each drive capability at the time of turning on the power elements 114a, 114b is modified to be identical by modifying the resistance value of the resistor 52 in response to the capability setting signal Sc.

The peak voltage detector 11 according to the present embodiment receives an input of a voltage at a node near the power supply from the junction of the respective drains of the power elements 113a, 113b, and detects the peak voltage of the main terminal of the switching element 113 at the time of turning on the switching element 114 based on the input voltage. The peak voltage detector 11 may detect the peak voltage based on the drain potential closest to any one of the power elements 113a, 113b. Therefore, it is possible to detect peak voltage without being affected by the parasitic component as much as possible, and the detection precision is enhanced.

The peak voltage detector 14 according to the present embodiment receives an input of a voltage at a node closer to the node 1 from the junction of the respective drains of the power elements 114a, 114b, and detects the peak voltage of the main terminal of the switching element 114 at the time of turning on the switching element 113 based on the input voltage. The peak voltage detector 14 may detect the peak voltage based on the drain potential closest to any of the power elements 114a, 114b. Therefore, it is possible to detect peak voltage without being affected by the parasitic component as much as possible, and the detection precision is enhanced.

According to the configuration of the present embodiment described above, it is possible to optimize the driving capability at the time of turning on the drivers 10, 13. Even when the gate drive apparatus 111 according to the present embodiment drives the switching elements 113, 114 in which multiple elements with the identical type are connected in parallel, the advantageous similar to the one in the first embodiment, in other words, the effect of suppressing the surge voltage without increasing the turn-on loss can be attained.

Ninth Embodiment

The following describes a ninth embodiment with reference to FIG. 15.

Figure 16:
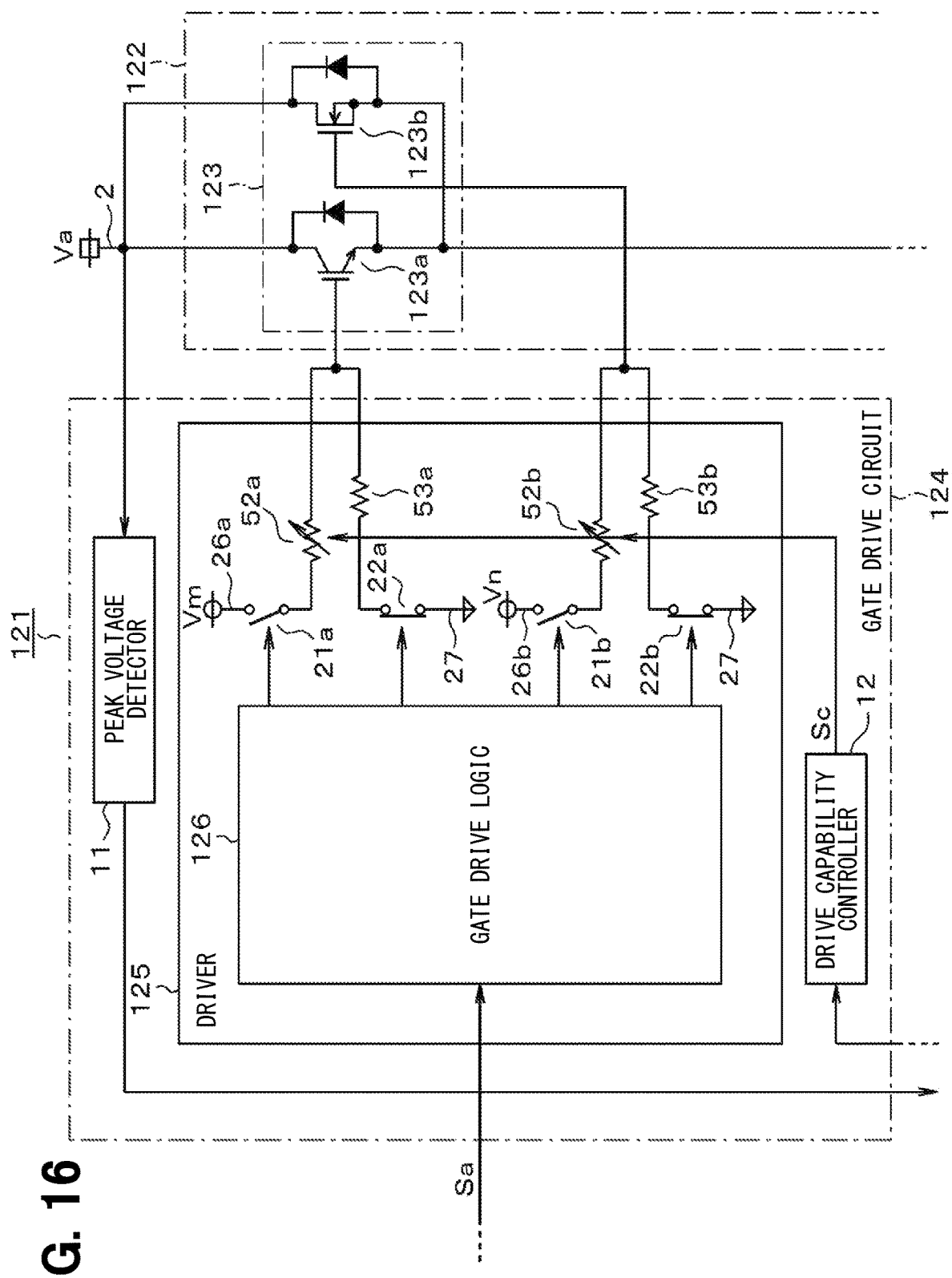
FIG. 16 schematically illustrates the configuration of a gate drive apparatus according to a ninth embodiment.

As illustrated in FIG. 16, a gate drive apparatus 121 according to the present embodiment drives two switching elements 103, 6. The switching elements 103, 6 are respectively included in an upper arm and a lower arm in a half-bridge circuit 122. The switching elements may also be referred to as switching devices. FIG. 16 illustrates a switching element 123 included in the upper arm, and the configuration for driving the switching element 123, in other words, the configuration at the upper arm side. However, the switching element included in the lower arm and the configuration for driving the switching element are identical to the configuration at the upper arm side.

The switching element 123 has two elements with different types being connected in parallel. The switching element 123 may have multiple elements with different types. For example, the switching element 123 may have three or more elements with different types being connected in parallel. The switching element 123 has two power elements 123a, 123b which are connected in parallel. The power elements 123a, 123b may also be referred to as power devices. The power element 123a includes a configuration identical to the switching element 5 in the configuration illustrated in, for example, FIG. 3, in other words, the configuration having the IGBT. The power element 123 has a configuration identical to the switching element 5 as illustrated in, for example, FIG. 1, in other words, the configuration having the MOSFET.

The gate drive apparatus 121 includes, for example, a gate drive circuit 124 for driving the switching element 123. The gate drive circuit 124 is different from the gate drive circuit 7 in each of the above embodiments such that the gate drive circuit 124 includes a driver 125 instead of the driver 10. The driver 125, as similar to the driver 10 illustrated in FIG. 7, drives the gate of the switching element 123 with a constant voltage. In this situation, the respective gates of the power elements 123a, 123b in the switching element 123 are separately driven.

In other words, the driver 125 includes switches 21, 22, resistors 52, 53 in the driver 10 as illustrated in FIG. 7 divided into two systems respectively for the power elements 123a and 123b. For the switches 21, 22 and the resistors 52, 53, "a" is appended to the tail of reference numeral of the configuration corresponding to the power element 123a, and "b" is appended to the tail of reference numeral of the configuration corresponding to the power element 123b.

The switch 21a opens or closes the path between the power supply line 26a supplied with the power supply voltage Vm and the upper stream terminal of the resistor 52a. The power supply voltage Vm, as similar to the power supply voltage Vb, is a voltage with reference to the potential of the power supply line 27, and sufficiently higher than the gate threshold voltage of the power element 123a. The lower stream terminal of the resistor 52a is connected to the gate of the power element 123a. The switch 22a opens or closes the path between the downstream terminal of the resistor 53a and the power supply line 27. The upstream terminal of the resistor 53a is connected to the gate of the power element 123a.

The switch 21b opens or closes the path between the power supply line 26b supplied with the power supply voltage Vn and the upstream terminal of the resistor 52b. The power supply voltage Vn, as similar to the power supply voltage Vb, is a voltage with reference to the potential of the power supply line 27, and sufficiently higher than the gate threshold voltage of the power element 123b. The downstream terminal of the resistor 52b is connected to the gate of the power element 123b. The switch 22b opens or closes the path between the downstream terminal of the resistor 53b and the power supply line 27. The downstream terminal of the resistor 53b is connected to the gate of the power element 123b.

In the above configuration, each gate resistance at the time of turning on the power elements 123a, 123b, in other words, each drive capability at the time of turning on the power elements 123a, 123b is modified to be identical by modifying the resistance value of the resistors 52a, 52b in response to the capability setting signal Sc. However, the value of the gate resistance for allowing the surge voltage reach a desired voltage is distinct in each of the power elements 123a, 123b. Therefore, the resistance value of each of the resistors 52a, 52b is independently set correspondingly to the specifications regarding the desired surge voltage. In the present embodiment, the resistance value of each of the resistors 52a, 52b is modified at the identical timing.

The gate drive logic 126 in the driver 125, as similar to the gate drive logic 25 in the driver 10 illustrated in FIG. 7, complementarily turns on or off the switches 21a, 22b based on the drive signal Sa, and complementarily turn on or off the switches 21b, 22b based on the drive signal Sa. The gate drive logic 126 includes a configuration for adjusting the timing of the drive signal Sa to initially turn on one of two power elements 123a, 123b at the time of turning on the switching element 123, and turn on the other one of power elements 123a, 123b after the predetermined delay time has elapsed. Additionally, the gate drive logic 126 initially turns off one of two power elements 123a, 123b at the time of turning off the switching element 123, and turn off the other one of power elements 123a, 123b after the predetermined delay time has elapsed. In the present embodiment, the power element 123a is firstly turned on, and the power element 123b is turned off later.

According to the configuration of the present embodiment described above, it is possible to optimize the driving capability at the time of turning on the driver 125, as similar to the first embodiment. Even when the gate drive apparatus 121 according to the present embodiment drives the switching element 123 in which multiple elements with the different types are connected in parallel, the advantageous similar to the one in the first embodiment, in other words, the effect of suppressing the surge voltage without increasing the turn-on loss can be attained.

In the above configuration, the surge voltage appears large at the time of turning on the power element 123a, which is firstly turned on. According to the above configuration, the drive capability at the time of turning the power element 123a, which is to be turned on initially, is optimized. In the present embodiment, the resistance value of each of the resistors 52a, 52b is modified at the identical timing. According to the present embodiment, in a situation where one of the power elements 123a and 123b is firstly turned on, the drive capability at the time of turning on the power element, which is to be firstly turned on, is optimized. Therefore, the above-mentioned effect can be reliably attained.

In a situation where the timing of turning on the power elements 123a, 123b is fixed and has no possibility for changing the timing, the configuration having a variable resistance may be provided for driving the power element which is initially to be turned on, and the resistance value is modified based on the capability setting signal Sc. In this situation, the drive capability controller 12 calculates the value of the drive capability at the time of turn-on and modifies the drive capability at the time of turn-on for one of the two power elements 123a, 123b which is the first one to be turned on.

Other Embodiments

The present disclosure is not limited to the embodiments that have been described above and illustrated in the drawings, but can arbitrarily be modified, combined, or expanded without departing from the gist of the present disclosure.

The numerical values and the like shown in each of the above embodiments are merely examples, and the present disclosure is not limited thereto.

The process of the flowchart or the flowchart described in this application includes a plurality of sections, and each section is expressed as, for example, S100. Each section may be divided into several subsections, while several sections may be combined into one section. Furthermore, each section thus configured may be referred to as a device, module, or means.

The present disclosure has been described based on examples, but it is understood that the present disclosure is not limited to the examples or structures. The present disclosure encompasses various modifications and variations within the scope of equivalents. In addition, various combinations and configurations, as well as other combinations and configurations that include only one element, more, or less, fall within the scope and spirit of the present disclosure.

What is claimed is:

1. A gate drive apparatus comprising:
   a driver configured to drive a gate of a first switching element as one of two switching elements respectively in an upper arm and a lower arm of a half-bridge circuit;
   a peak voltage detector configured to detect a peak voltage at a main terminal of a second switching element as another one of the two switching elements in a situation where the first switching element is turned on; and
   a drive capability controller configured to:
      calculate a value of drive capability in a situation where the driver turns on the first switching element, in a condition that the peak voltage at the main terminal of the second switching element detected by the peak voltage detector does not exceed a tolerance value of a voltage at the main terminal of the second switching element determined according to a specification of the second switching element; and
      modify the drive capability in a situation where the driver turns on the first switching element, based on a calculated result of the value of the drive capability.

2. The gate drive apparatus according to claim 1,
   wherein the driver is a first driver,
   wherein the drive capability controller is a first drive capability controller, and
   wherein the drive capability is first drive capability, the gate drive apparatus further comprising:
   a second driver configured to drive a gate of the second switching element;
   a first peak voltage detector configured to detect a peak voltage at a main terminal of the first switching element in a situation where the second switching element is turned on, the first peak voltage detector being different from a second peak voltage detector as the peak voltage detector;
   a second drive capability controller configured to:
      calculate a value of second drive capability in a situation where the second driver turns on the second switching element, in a condition that the peak voltage at the main terminal of the first switching element detected by the first peak voltage detector does not exceed a tolerance value of a voltage at the main terminal of the first switching element determined according to a specification of the first switching element; and
      modify the second drive capability in a situation where the second driver turns on the second switching element, based on a calculated result of the value of the second drive capability; and
   a transmitter configured to:
      transmit a detected value of the second peak voltage detector to the first drive capability controller; and
      transmit a detected value of the first peak voltage detector to the second drive capability controller,
   wherein a first configuration having the first driver, the first peak voltage detector and the first drive capability controller and a second configuration having the second driver, the second peak voltage detector and the second drive capability controller are separately included in different devices.

3. The gate drive apparatus according to claim 2,
   wherein the transmitter transmits a detected value of the first peak voltage detector or a detected value of the second peak voltage detector through an insulator for insulating the different devices.

4. The gate drive apparatus according to claim 1, further comprising:

wherein the driver is a first driver,
wherein the drive capability controller is a first drive capability controller, and
wherein the drive capability is first drive capability, the gate drive apparatus further comprising:
a second driver configured to drive a gate of the second switching element;
a first peak voltage detector configured to detect a peak voltage at a main terminal of the first switching element in a situation where the second switching element is turned on, the first peak voltage detector being different from a second peak voltage detector as the peak voltage detector; and
a second drive capability controller configured to:
calculate a value of second drive capability in a situation where the second driver turns on the second switching element, in a condition that the peak voltage at the main terminal of the first switching element detected by the first peak voltage detector does not exceed a tolerance value of a voltage at the main terminal of the first switching element determined according to a specification of the first switching element; and
modify the second drive capability in a situation where the second driver turns on the second switching element, based on a calculated result of the value of the second drive capability,
wherein a first configuration having the first driver, the first peak voltage detector and the first drive capability controller and a second configuration having the second driver, the second peak voltage detector and the second drive capability controller are included in an identical device.

5. The gate drive apparatus according to claim 1,
wherein the drive capability controller is configured to:
calculate a value of the drive capability in a driving period of the first switching element; and
modify the drive capability until a situation where the first switching element is turned on in a next driving period subsequent to the driving period during which the value of the drive capability is calculated.

6. The gate drive apparatus according to claim 1,
wherein the drive capability controller is configured to calculate a value of the drive capability and modify the drive capability in a period longer than a driving period of the first switching element.

7. The gate drive apparatus according to claim 1, further comprising:
a detector configured to detect at least one of
a current flowing through the first switching element,
a voltage applied to the main terminal of the first switching element in a situation where the first switching elements is turned on, and
a temperature of the first switching element,
wherein the drive capability controller is further configured to correct a calculated result of the value of the drive capability based on a detected result detected by the detector.

8. The gate drive apparatus according to claim 1,
wherein the driver is further configured to drive the first switching element with a constant current, and
wherein the drive capability controller is further configured to modify the drive capability of the driver through modifying a gate current in a situation where the first switching element is turned on.

9. The gate drive apparatus according to claim 1,
wherein the drive capability controller is further configured to modify the drive capability of the driver through modifying a gate resistance of a the first switching element in a situation where the first switching element is turned on.

10. The gate drive apparatus according to claim 1,
wherein each of the two switching elements includes a metal-oxide-semiconductor field effect transistor.

11. The gate drive apparatus according to claim 1,
wherein each of the two switching elements includes an insulated gate bipolar transistor.

12. The gate drive apparatus according to claim 1,
wherein one of the two switching elements includes a metal-oxide-semiconductor field effect transistor, and
wherein another one of the two switching elements includes a diode.

13. The gate drive apparatus according to claim 1,
wherein one of the two switching elements includes an insulated gate bipolar transistor, and
wherein another one of the two switching elements includes a diode.

14. The gate drive apparatus according to claim 1,
wherein each of the two switching elements includes a plurality of devices having distinct types and connected in parallel,
wherein the driver is configured to separately drive respective gates of the devices, and
wherein the drive capability controller is configured to, for one of the devices that is turned on first in the devices, calculate a value of drive capability in a situation where the one of the devices is turned on, and modify the drive capability of the one of the devices in a situation where the one of the devices is turned on.

* * * * *